(12) United States Patent
Winkler et al.

(10) Patent No.: US 7,282,711 B2
(45) Date of Patent: Oct. 16, 2007

(54) MULTIPLE ELECTRON BEAM DEVICE

(75) Inventors: Dieter Winkler, Heimstetten (DE);
Pavel Adamec, Heimstetten (DE);
Achim Göhl, Heimstetten (DE);
Helmut Banzhof, Heimstetten (DE)

(73) Assignee: ICT, Integrated Circuit Testing Gesellschaft fur Halbleiterpruftechnik MBH, Heimstetten (DE)

( * ) Notice: Subject to any disclaimer, the term of this patent is extended or adjusted under 35 U.S.C. 154(b) by 0 days.

(21) Appl. No.: 10/491,939

(22) PCT Filed: Oct. 4, 2002

(86) PCT No.: PCT/EP02/11135

§ 371 (c)(1),
(2), (4) Date: Sep. 7, 2004

(87) PCT Pub. No.: WO03/032361

PCT Pub. Date: Apr. 17, 2003

(65) Prior Publication Data

US 2004/0256556 A1 Dec. 23, 2004

(30) Foreign Application Priority Data

Oct. 5, 2001 (EP) .................................. 01123855

(51) Int. Cl.
*H01J 37/21* (2006.01)

(52) U.S. Cl. .................... 250/310; 250/307; 250/491.1
(58) Field of Classification Search ................ 250/310
See application file for complete search history.

(56) References Cited

U.S. PATENT DOCUMENTS 4,494,005 A    1/1985    Shibata et al.

(Continued)

FOREIGN PATENT DOCUMENTS

JP          56-83029      7/1981
WO          WO 00/67291   11/2000

OTHER PUBLICATIONS

Liu, et al. "Micro-objective lens with compact secondary electron detector for miniature low voltage electron beam systems," J. Vac. Sci. Technol. B 14(6), Nov./Dec. 1996.

(Continued)

*Primary Examiner*—Jack I. Berman
*Assistant Examiner*—Phillip A. Johnston
(74) *Attorney, Agent, or Firm*—Patterson & Sheridan, LLP

(57) ABSTRACT

The invention provides electron multiple beam devices (1) for probing or structuring a non-transparent specimen (20) with primary electron beams (14) with an array of electron beam sources (3) to generate multiple primary electron beams (14), an electron sensor (12) with electron sensor segments (12a) to detect electrons of the primary electron beams (14) and at least one anode (7) to direct the primary electron beams (14) towards the electron sensor (12). The electron sensor (12) serves to inspect the primary electron beams (14), calibrate the positions of the primary electron beams (14) and possibly adjust final focus length (13) and currents of the primary electron beams before or after a probing or structuring the upper surface (20a) of a non-transparent specimens (20). Further, methods to inspect primary electron beams (14), to adjust final focus lengths (13) and to calibrate the multiple electron beam device (1) are provided.

35 Claims, 13 Drawing Sheets

U.S. PATENT DOCUMENTS

| | | | |
|---|---|---|---|
| 4,721,842 A | 1/1988 | Farrell | |
| 5,122,663 A | 6/1992 | Chang et al. | |
| 5,155,412 A | 10/1992 | Chang et al. | |
| 5,430,292 A * | 7/1995 | Honjo et al. | 250/310 |
| 5,929,557 A | 7/1999 | Makishima et al. | |
| 5,933,211 A | 8/1999 | Nakasugi et al. | |
| 5,969,362 A | 10/1999 | Kawata et al. | |
| 5,977,719 A | 11/1999 | Makishima | |
| 5,981,962 A | 11/1999 | Groves et al. | |
| 6,028,662 A | 2/2000 | Sturans et al. | |
| 6,145,438 A | 11/2000 | Berglund et al. | |
| 2001/0004185 A1 | 6/2001 | Muraki et al. | |
| 2001/0010362 A1 | 8/2001 | Simizu | |

OTHER PUBLICATIONS

International Preliminary Examination Report, dated Aug. 22, 2003, for PCT/EP02/11135.

International Search Report, dated Feb. 12, 2003, for PCT/EP02/11135.

European Patent Office Search Report, dated Mar. 7, 2002, for EP 01123855.7.

Spindt, "A Thin-Film Field-Emission Cathode," Journal of Appl. Physics, vol. 39 (1968) No. 7, p. 3404-3505.

* cited by examiner

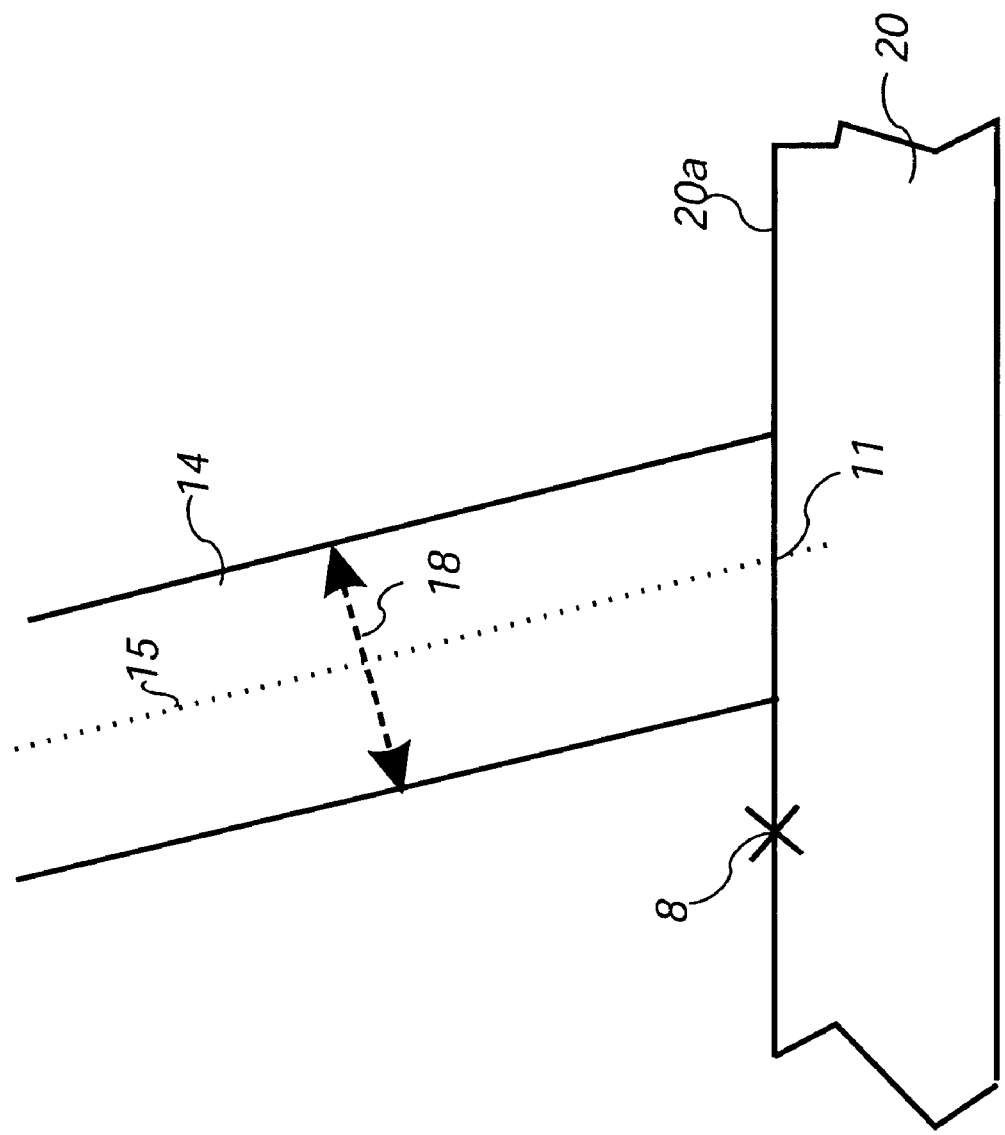

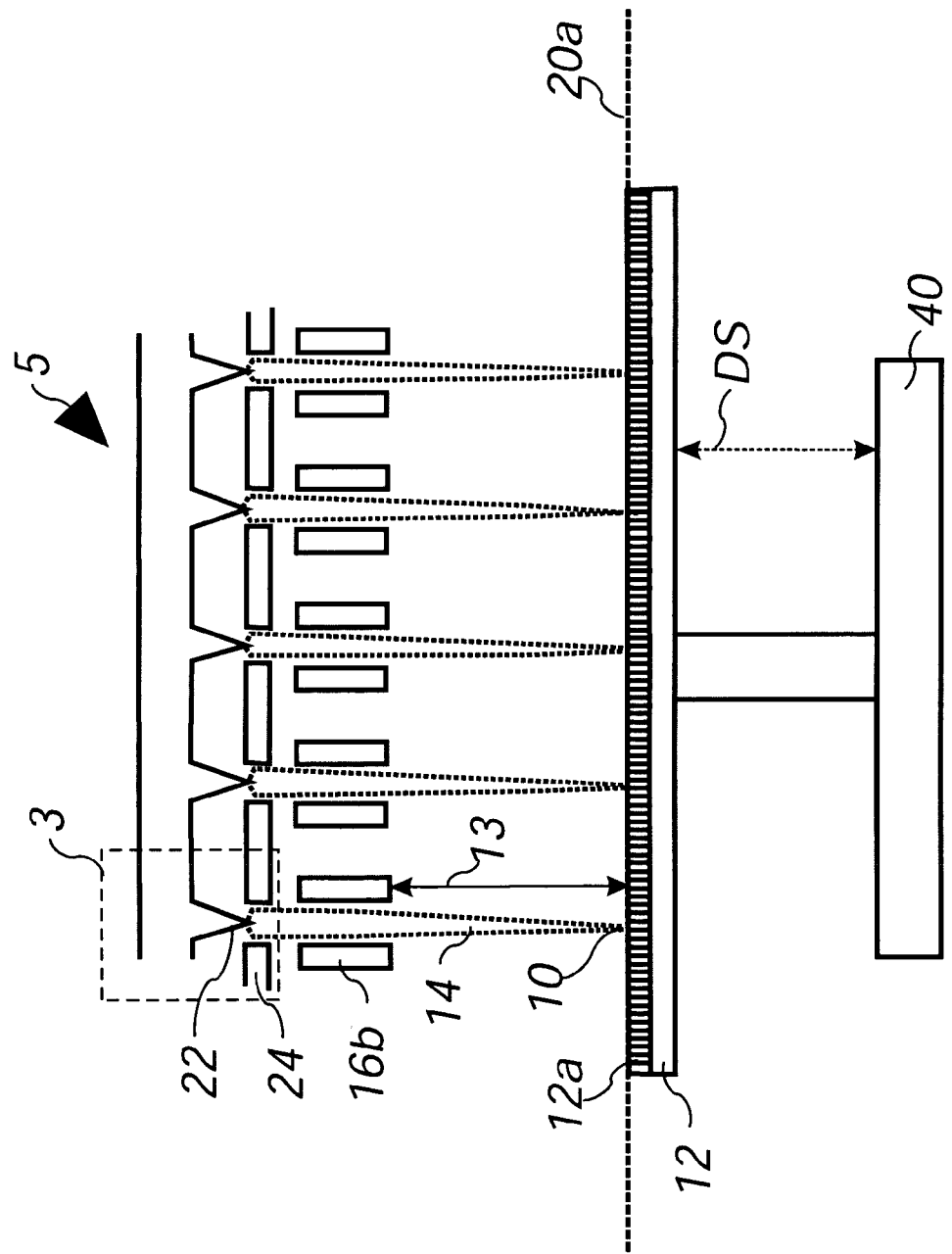

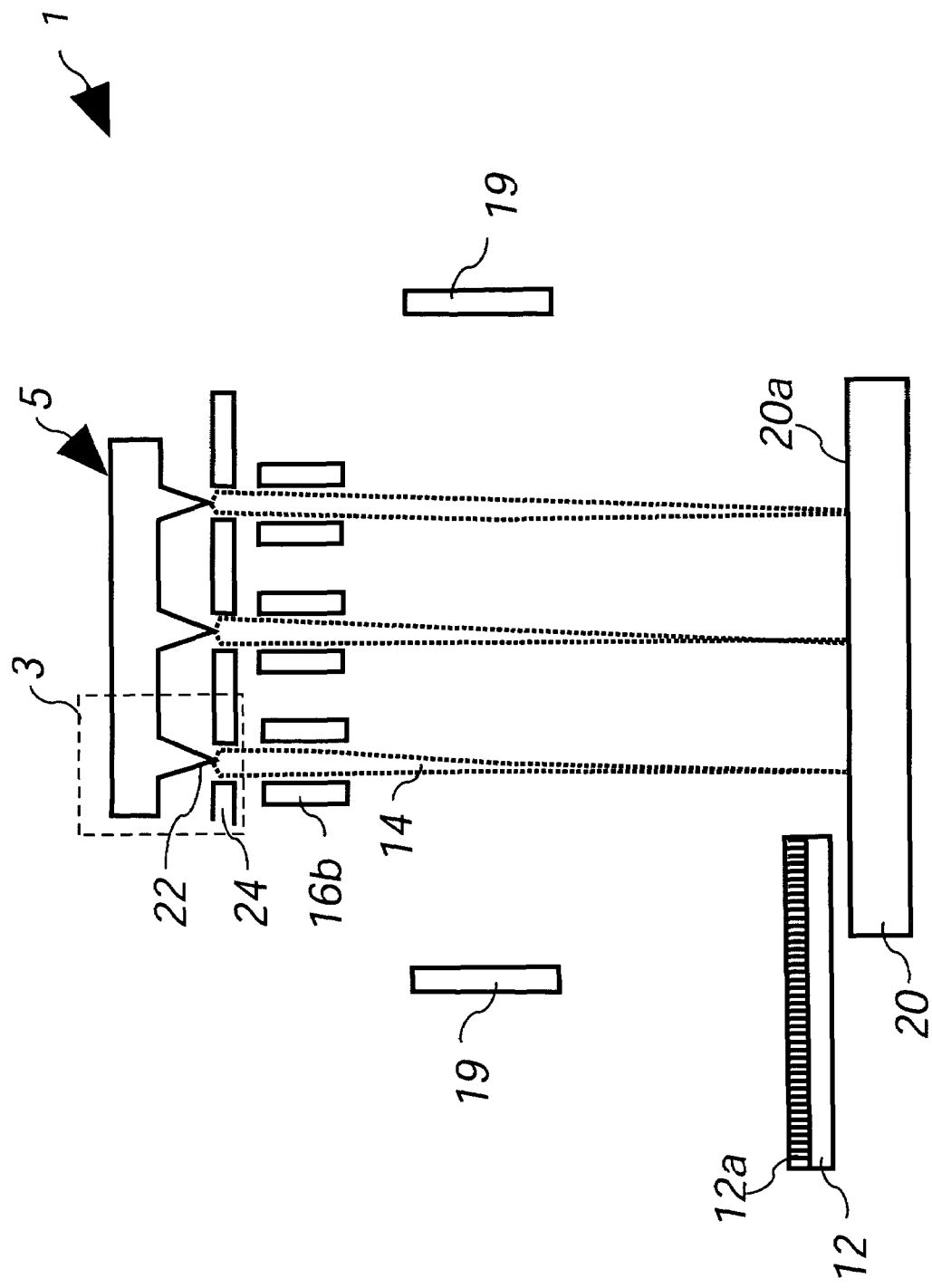

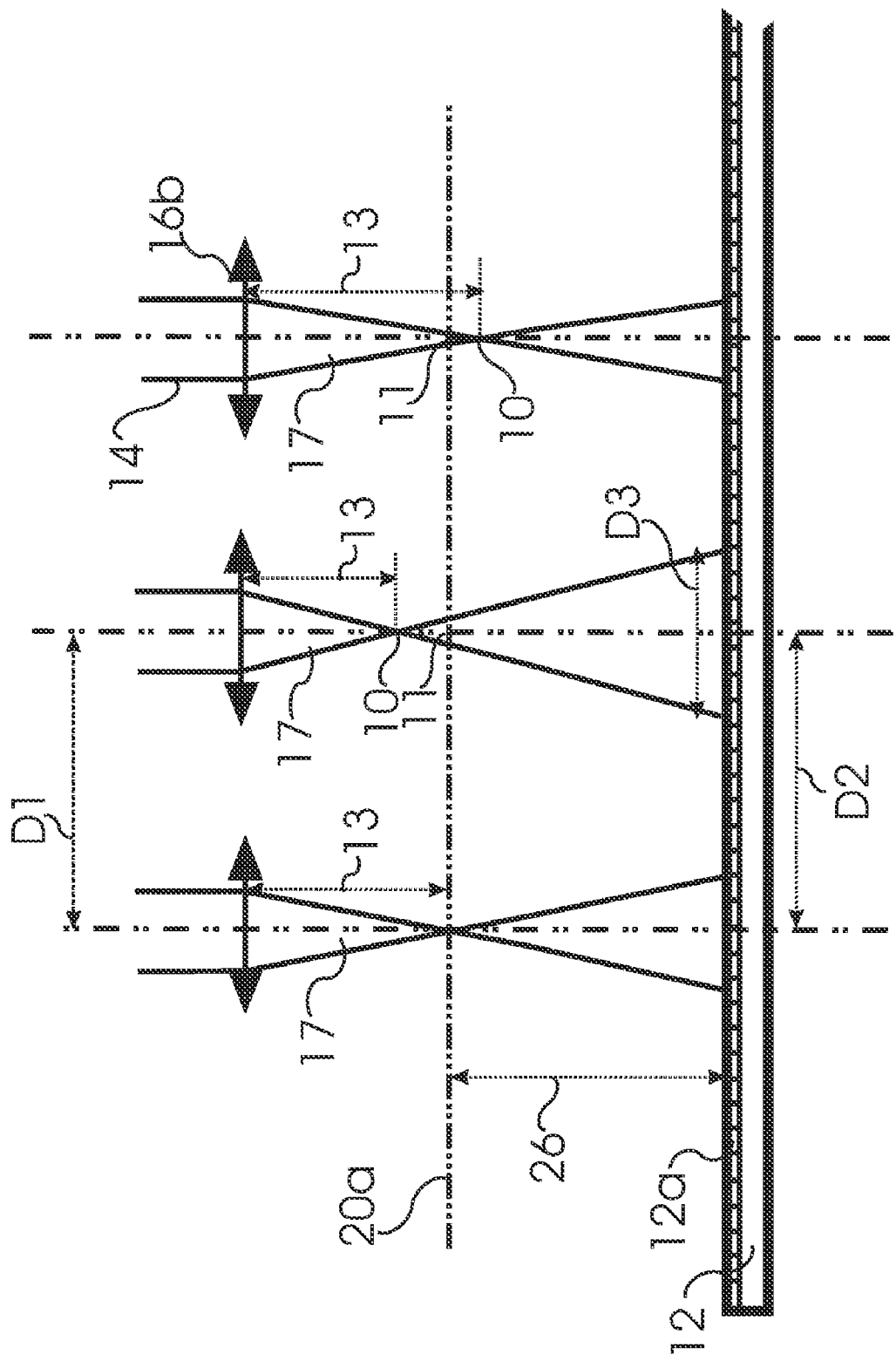

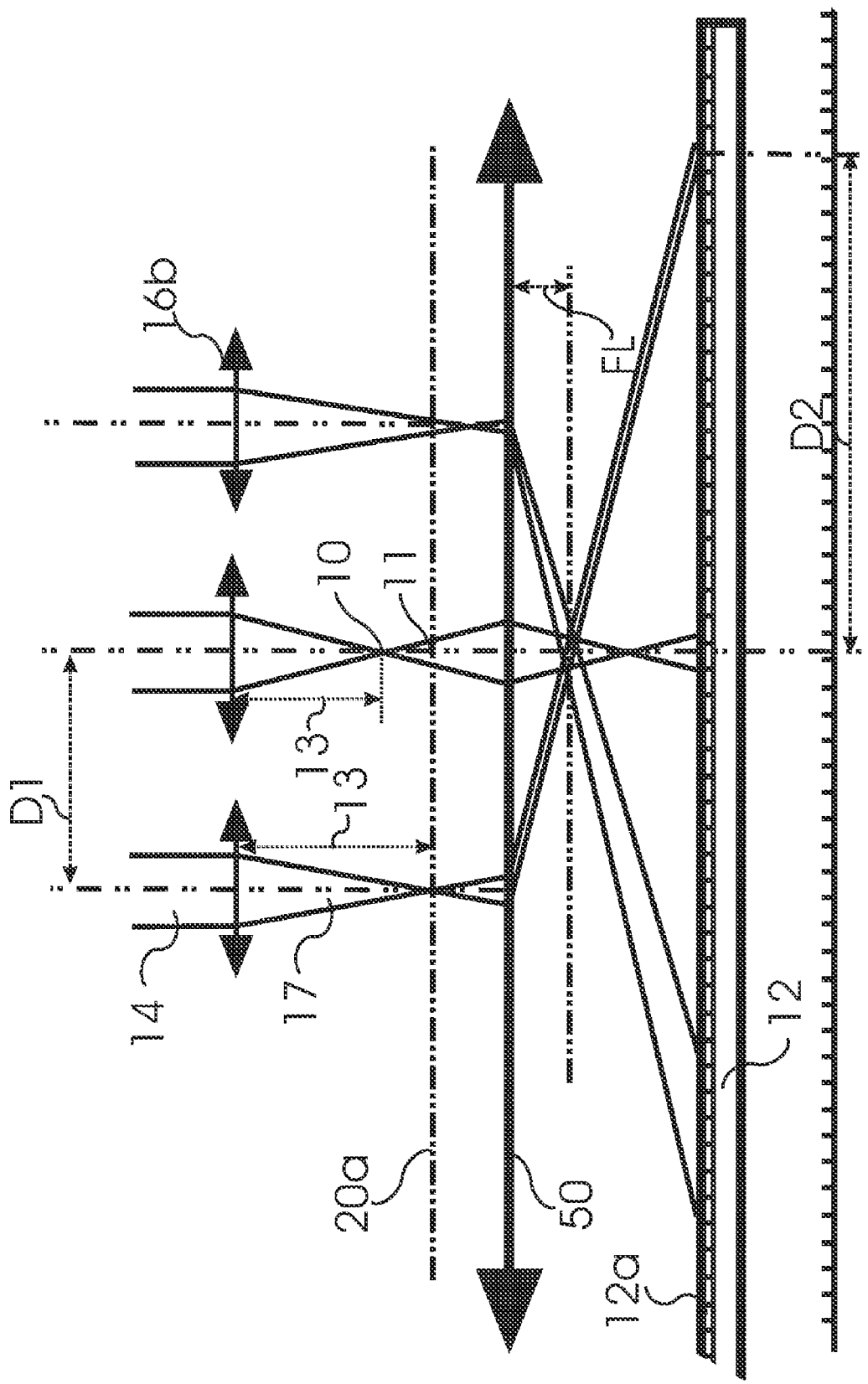

MULTIPLE ELECTRON BEAM DEVICE

FIELD OF THE INVENTION

The invention relates to a multiple electron beam device and methods to inspect multiple electron beams of such electron multiple beam devices. Such electron multiple beam devices are used for probing or structuring non-transparent specimens, like e.g. wafers.

BACKGROUND OF THE INVENTION

Technologies like microelectronics, micromechanics and biotechnology have created a high demand in industry for structuring and probing specimens within the nanometer scale. On such a small scale, probing or structuring is often done with electron beams which are generated and focussed in electron beam devices like electron microscopes or electron beam pattern generators. Electrons beams offer superior spatial resolution compared to e.g. photon beams due to their short wave lengths at a comparable particle energy.

While electron beam devices can meet high spatial resolution requirements they are often too slow to deliver the throughput needed in large scale manufacturing. To overcome the throughput limitations, electron beam devices with multiple beams have been proposed with various designs. In U.S. Pat. No. 6,145,438 a multiple electron beam device with microcolumns is proposed. Each microcolumn is able to generate an electron beam and direct it towards a common specimen with high spatial resolution. Usually microcolumns comprise electron beam optical components for focussing and deflecting the electron beams individually. Such a design allows for a high flexibility because each electron beam can be operated independently. However, microcolumns have diameters of at least 1 to 2 cm, which makes it difficult to generate electron beams with a density of more than one or two electron beams per square centimeter.

Electron multiple beam devices with higher electron beam density usually rely on arrays of field emission cathodes where the field emission cathodes are integrated onto a substrate. Such field emission cathode arrays are fabricated by using micromechanical or microelectronic fabrication techniques. They were first proposed by C. A. Spindt (Journal of Appl. Physics, Vol 39 (1968) No.7, p. 3504-3505). Field emission cathode arrays usually comprise an array of emitter tips and an array of extracting electrodes with extracting electrode and emitter tip facing each other one to one. Due to the sharp apices of the emitter tips, and due to the short distances between emitter tip and extracting electrode it is possible to generate an extremely high electric field at the apices with moderate voltages. As the electric field at the surface of an apex rises above say $10^7$ V/cm, electrons in the emitter tip are able to tunnel through the surface potential barrier of the apex to be emitted into free space. This fact is used to generate primary electron beams where the electron beam currents are controlled by the voltages between emitter tip and facing extracting electrode.

Field emission cathode arrays have since evolved to advanced devices with various designs and features. It is now possible to integrate arrays of field emission cathodes with a pitch of a few micrometers or smaller onto a substrate. With such technology it is possible to integrate hundreds, thousands or even millions of field emission cathodes onto a substrate of the size of a thumbnail. Such high integration density however makes it difficult to control directions, focus lengths and electron beam currents of the primary electron beams individually.

To provide individual control of the final focus lengths of multiple electron beams of highly integrated field emission cathode arrays, it has been proposed to integrate an array of gate electrodes on the field emission cathode array with gate electrode and field emission cathode facing each other one to one. Such field emission cathode arrays are disclosed, e.g., in U.S. Pat. No. 5,929,557. The voltage of each gate electrode can be controlled individually to change or adjust shape or direction of each primary electron beam individually. In particular, the voltages of each gate electrode can be used to change or adjust the final focus lengths of the final foci of the primary electron beams individually, the term "final focus" thereby throughout this application refers to the focus of a primary electron beam which is meant to probe or structure the surface of a specimen. Shape, position and length of the final focus of a focussed primary electron beam is of particular importance since it defines at what position and spatial resolution the surface of a non-transparent specimen is probed or structured.

For an electron beam device with a single primary electron beam, positioning of the primary electron beam, adjustment of the focal length and control of the electron beam current is straightforward and can be carried out by hand. E.g., directing the primary electron beam to the desired primary electron beam position can be done by scanning a surface region of interest of the specimen and observing the image created by the secondary particles. The scan is usually repeated with various operational parameters of the magnetic or electrostatic lenses until the image of the structured upper surface shows best spatial resolution.

For an electron multiple beam device, the procedure of finding the primary electron beam position and the determining the beam currents is more complicated for several reasons. First, the primary electron beam position with respect to the specimen has to be known not only for one primary electron beam but for many primary electron beams. Second, the positions of the field emission cathodes in a field emission cathode array in practice show deviations from specified positions that limit the precision for probing or structuring a specimen. Third, when adjusting thousands or even millions of electron beams it is mandatory to adjust the primary electron beams in parallel to save time. However it is difficult to adjust the primary electron beams in parallel until the images created by each primary electron beam show best resolution. Fourth, the detection of secondary particles for the purpose of measuring the primary electron beam positions in parallel is hampered by the confusion of not knowing which secondary particle originates from what primary electron beam. Fifth, the measurement of the primary electron beam positions and the final focus lengths takes some time, during which the non-transparent specimen may charge up in the region where the measurements are being done. Such charge-up can destroy or damage the specimen. And finally, even with the same operational parameters for each electron beam source, the currents of the primary electron beams may vary considerably. This can cause inhomogeneities on a structured surface of a non-transparent specimen which are beyond acceptable specifications.

SUMMARY OF THE INVENTION

The present invention intends to provide improved electron multiple beam devices. According to one aspect of the present invention a multiple electron beam device is provided as specified in independent claim 1.

According to a second aspect of the present invention a multiple electron beam device is provided as specified in independent claim 3.

According to a third aspect of the present invention a method to inspect multiple primary electron beams is provided as specified in independent claim 21.

According to a fourth aspect of the present invention a method to calibrate a multiple electron beam device is provided as specified in independent claim 22.

According to a fifth aspect of the present invention a method to adjust final focus lengths of focussed multiple primary electron beams to desired final focus lengths is provided as specified in independent claim 26.

Further advantages, features, aspects and details of the invention are evident from the dependent claims, the description and the accompanying drawings. The claims are intended to be understood as a first non-limiting approach of defining the invention in general terms.

The invention according to claim 1 discloses a multiple electron beam device for probing or structuring a non-transparent specimen with primary electron beams where the at least one anode directs the primary electron beams towards the electron sensor. Due to the segmentation of the electron sensor, positions of the primary electron beams on the electron sensor can be measured before or after probing or structuring the non-transparent specimen. Preferably, the measurements of the positions of the primary electron beams on the electron sensor allow to determine the paths along which the primary electron beams run. Preferably, once a non-transparent specimen is placed into the primary electron beams specimen for probing or structuring its upper surface, the measurements of the primary electron beams on the electron sensor serve to determine the positions where said primary electron beams impinge on the surface of the non-transparent specimen.

Measuring the paths of the primary electron beams allows to determine or adjust the lateral distances between neighboring primary electron beams at a given set of operational parameters of the electron multiple beam device. It also allows to determine the positions of where the primary electron beams impinge on the non-transparent specimen when it is placed into the primary electron beams. Knowing the positions of where the primary electron beams impinge on the surface of the non-transparent specimen is a prerequisite for probing or structuring the surface of a non-transparent specimen in a determined pattern.

The measurements of the primary electron beam positions on the electron sensor preferably serve to determine the paths of the primary electron beams at given sets of operational parameters. Operational parameters are e.g. the voltages of the anodes, voltages or currents that determine the electrical or magnetic fields of focussing components and deflectors as well as the voltages of the extracting electrodes of the field emission cathodes. Operational parameters of importance can also be parameters like the position of the non-transparent specimen with respect to the electron sensor or the positioning of the electron beam sources with respect to the electron sensor.

Because the specimen according to the invention is essentially non-transparent to the primary electron beams, the primary electron beams do not reach the electron sensor when they are directed towards the non-transparent specimen. Therefore, the position measurements can be carried out only before or after probing or structuring the non-transparent specimen. The positions of the primary electron beams impinging on the non-transparent specimen can be determined with high precision only when the position of the non-transparent specimen with respect to the electron sensor, in particular the distance between the electron sensor and the upper surface of the non-transparent specimen, is known to high precision.

According to claim 22, a method to calibrate the multiple electron beam device for probing or structuring a non-transparent specimen is proposed where a calibration map is generated that relates measured positions of the primary electron beams on the electron sensor to operational parameters of the multiple electron beam device that direct the primary electron beams to said positions on the electron sensor. Preferably, the calibration map also relates measured final focus lengths of the primary electron beams to operational parameters of the multiple electron beam device that produce said final focus lengths. Preferably, the calibration map also relates measured currents of the primary electron beams to operational parameters of the electron multiple beam that produce said electron currents. The more relational information of this kind is generated and stored the more detailed scans can be carried out with the primary electron beams to probe or structure a surface of a non-transparent specimen.

Preferably, the calibration map is used to generate a sequence of operational parameters of the multiple electron beam device that guides the primary electron beams over the upper surface of the non-transparent specimen to probe or structure same with a desired pattern. Once a calibration map is generated for the electron multiple beam device, the non-transparent specimen can be probed or structured with high precision without measuring the primary electron beam positions simultaneously.

Preferably, the calibration map is generated electronically. Preferably, the calibration map is generated by reading the operational parameters of the multiple electron beam device at the time when desired positions, currents or final focus lengths of the primary electron beams are being measured with the electron sensor. Preferably, the calibration map is generated by writing the operational parameters of the multiple electron beam device on some electronic storage medium, e.g. a tape, disk or volatile random access memories.

The multiple electron beam device according to the invention allows to perform a calibration of the electron multiple beam device. The calibration serves to generate a calibration map. The calibration map relates positions of the primary electron beams on the electron sensor, final focus lengths of the primary electron beams, the currents of the primary electron beams or any combination of the three types of parameters with the corresponding operational parameters of the electron multiple beam device. The calibration map in turn allows to provide a sequence of operational parameters that serves to probe or structure the surface of the non-transparent specimen in a well-determined pattern. With the calibration map, probing or structuring of the surface of the non-transparent specimen can be performed without having to control the primary electron beam positions, final focus lengths or currents at the same time. The calibration according to the invention also allows to compensate for defects of the multiple electron beam device and in particular for defects of the array of electron beam sources. E.g. the calibration can be used to compensate for deviations of primary electron beam positions or final focus lengths from desired primary electron beam positions and desired final focus lengths, which may be due to misaligned electron beam sources within the array of electron beam sources, due to inhomogeneities of lenses and deflectors or due to other imperfections of the electron multiple beam device.

Preferably, the multiple electron beam device performs the position measurements of the primary electron beams in parallel. This can make the calibration process extremely fast. Preferably, the segmentation of the electron sensor is high enough in order to enable the electron sensor to distinguish which electrons are coming from what primary electron beam.

Preferably, the calibration procedure is automated, preferably by using a control unit that reads the signals from the electron sensor. Preferably, the control unit calculates the primary electron beam positions and preferably also the final focus lengths from the electronic signals coming from the electron sensor. Preferably, the control unit uses the position measurements to adjust the primary electron beam positions to desired primary electron beam positions by changing the voltages for the electron beam sources, of the lenses or deflectors or any combination of the three. Preferably, the control unit also uses the final focus length measurements to adjust the final focus lengths to desired final focus lengths by changing the voltages that control the final focus lengths.

Further preferably, the control unit uses the current measurements of the primary electron beams to adjust the currents to desired currents by changing the voltages that control the currents of the primary electron beams. The adjustment can be carried out e.g. by a closed circuit, where the voltage changes are based on the measured primary electron beam currents.

Preferably, the control unit uses electronic signals from the electron sensor to determine whether primary electron beams are to be switched on or off. Switching individual primary electron beams on or off may be necessary to scan desired patterns on a non-transparent specimen during probing or structuring. Therefore, it is preferred that the control unit is able to check that primary electron beams that are commanded to be switched off are measured to be switched off; equally it is preferred that primary electron beams that are commanded to be switched on are measured to be switched on. Further, it is also preferred that the control unit uses electronic signals from the electron sensor to determine the fluctuation of the currents of the primary electron beams (current noise). Electron beam sources that generate primary electron beams with too high current noise usually are preferably to be switched off.

The measurements of the primary electron beam positions on the electron sensor preferably serve to evaluate the array of electron beam sources and the electron beam optical components for given operational parameters. They can be used to identify deviations of the primary electron beams from desired primary electron beam positions, deviations of final focus lengths from desired final focus lengths and/or deviations of primary electron beam currents from desired primary electron beam currents. In addition to identifying deviations, the measurements can also be used to correct deviations by adjusting primary electron beam positions to desired primary electron beam positions, adjusting final focus lengths of the primary electron beams to desired final focus lengths and/or by adjusting primary electron beam currents to desired primary electron beam currents. Even more preferred, measurements of the primary electron beam positions on the electron sensor serve to determine the operational parameters of the multiple electron beam device that generate desired positions of the primary electron beams on the electron sensor. Also preferably, the measurements of the primary electron beam currents serve to determine the operational parameters of the multiple electron beam device that generate desired currents. Also preferably, the measurements of the final focus lengths serve to determine the operational parameters of the multiple electron beam device that generate desired final focus lengths.

Preferably, the method to calibrate the multiple electron beam device according to the invention is being performed when the non-transparent specimen is placed out of the primary electron beams. This way, the non-transparent specimen does not charge up during the position measurements, which otherwise could destroy the non-transparent specimen. Preferably, the calibration is performed in certain time intervals to check for deviations over time due to wear or other time-related changes of the electron multiple beam device. Even more preferred calibration is performed before each probing or structuring of a non-transparent specimen in order to have tight control on the primary electron beam positions or primary electron beam currents when they probe or structure the surface of a non-transparent specimen.

Preferably, the multiple electron beam device comprises focussing components to focus the primary electron beams to final focus lengths. This way, probing or structuring of the surface of a non-transparent specimen can be done with significantly higher spatial resolution. Preferably, the primary electron beams are focussed with final focus lengths that the final focus positions come to lie on the surface of the non-transparent specimen. With such focus lengths, the highest possible spatial resolution for probing or structuring can be achieved.

According to the invention, the primary electron beams are generated by an array of electron beam sources, preferably an array of microcolumns or a field emission cathode array. According to claim 1, the array of electron beam sources is a field emission cathode array. A field emission cathode is an electron source with an emitter tip and an extracting electrode where the voltage between emitter tip and extracting electrode controls the emission current of the emitter tip into free space. Preferably, the field emission cathode array is integrated on a substrate, preferably a semiconductor substrate. The packaging density of the field emission cathodes on a substrate is preferably larger than 100 $1/cm^2$, preferably larger than $10^4$ $1/cm^2$ and even more preferred larger than $10^6$ $1/cm^2$ or $10^8$ $1/cm^2$. The larger the packaging density of the field emission cathodes on a field emission cathode array of given size, the higher the throughput for probing or structuring the surface of a non-transparent specimen.

The array of electron beam sources according to claim 3 in one preferred embodiment is a field emission cathode array as described above. In another preferred embodiment, the array of electron beam sources is made of discrete electron beam sources like thermionic electron cathodes, field emitting cathodes or cold field emitting cathodes. Preferably the electron beam sources are arranged at well-defined positions. The electron beam sources may also be the electron beam sources of microcolumns. A microcolumn is an electron beam optical system with electron beam source that generates an electron beam and directs it towards an anode (see e.g. U.S. Pat. Nos. 5,155,412 and 5,122,663 which is incorporated herein by reference). A multiple electron beam device with an array of microcolumns is advantageous because it allows to control final focus lengths, positions and/or currents of the primary electron beams with high precision. Preferably, the distances between such neighboring electron beam sources are smaller than 5 cm and preferably smaller than 1 cm. Preferably, the electron beam sources can be switched on and off individually in order to allow parallel beam operation as well as single beam operation, depending on the application.

The multiple electron beam device according to claim 3 is also provided with focussing components to generate final foci with final focus lengths. The focussing components can be globally focussing components where each focussing component controls the final focus lengths of the primary electron beams simultaneously; however preferably, the focussing components are individually focussing components where each focussing component controls the final focus lengths of the primary electron beams individually. Individually focussing components preferably are gate electrodes near the electron beam sources whose voltages control the final focus lengths of the corresponding primary electron beams.

Preferably, the final focus lengths can be determined by measuring the number of the electron sensor segments hit by each primary electron beam. The number of segments hit by a primary electron beam reflects the cross section of a primary electron beam on the electron sensor. Preferably, the measured cross-section in turn is used to calculate the distance between the final focus position of that primary electron beam and the electron sensor. The distance between the final focus position to the electron sensor in turn determines the final focus length. The calculation of the distance between final focus position and electron sensor is preferably based on geometrical calculations that involve the cross sections of the primary electron beams before final focussing and the distance between electron sensor and focussing component.

Compared to the measurements of primary electron beam positions and final focus lengths by means of secondary particles, the measurement by detecting the primary electron beam particles offers many advantages: first, the detection of the primary electron beam electrons can be detected without having to deal with interfering electrons from neighboring primary electron beams, if the segmentation of the electron sensor is high enough. This is in contrast to the detection of secondary particles which scatter off the upper surface of the non-transparent specimen in all directions, causing confusion at the secondary detectors about what secondary particles belong to what primary electron beam.

Second, the determination of the positions and cross sections of the primary electron beams can be determined with a high statistics signal which accelerates the measurements. Secondary particle detectors in electron beam devices, instead, usually cover only a fraction of the solid angle and see only a fraction of the full signal.

Third, the electron sensor is preferably firmly assembled into the electron multiple beam device so that the electron sensor does not move or slip within the multiple electron beam device. Therefore a high reproducibility of the position measurements can be achieved. Measurements of positions and final focus lengths of primary electron beams by means of secondary particle instead suffer from uncertainties due to changing upper surfaces and positioning of every new specimen.

The multiple electron beam device according to the invention probes or structures specimens which are non-transparent to the electron beams. Non-transparent means that preferably no more than 1 ppm (part per million), preferably no more than 0.001 ppm and even more preferably no primary electron beams hitting the specimens pass through the specimen. This implies that the specimens must show a minimum thickness, which depends on the material of the specimen and the energy of the electrons of the primary electron beams. The specimen preferably is a semiconductor wafer with a thickness larger than 100 μm, preferably larger than 500 μm, or a biological specimen with a thickness larger than 1000 μm.

Preferably, the upper surface distance of the non-transparent specimens in a multiple electron beam device is known. The upper surface distance is the distance between the electron sensor and the upper surface of a non-transparent specimen when its surface is probed or structured. If the upper surface of a specimen is coplanar with the electron sensor, the upper surface distance is given by a single number, given by the vertical distance between the electron sensor segments and the upper surface of the specimen. Otherwise the upper surface is a function of the lateral position on the electron sensor.

Due to the non-transparency of the specimen, the primary electron beams end essentially on the surface of the specimen facing the incoming primary electron beams, which in this application is called "upper surface of the non-transparent specimen". Preferably, the positions where the primary electron beams hit the electron sensor are measured before or after probing or structuring the non-transparent specimen. This implies that the non-transparent specimen is not exposed to the electron beams when the primary electron beam position measurements are being performed. This reduces the problem of charge-up of the specimen.

The present invention is limited to electron multiple beam devices that are used for probing or structuring non-transparent specimens. This implies that the primary electron beams according to the invention essentially probe or structure the upper surface of the specimen. Probing refers to the process when the upper surface of the specimen is inspected without significantly changing the upper surface of the specimen, like e.g. being done for a scanning electron microscope. Structuring refers to the process when the upper surface of the specimen is changed by the primary electron beams, e.g. to implement a pattern into the upper surface at the upper surface. Such devices are also known as electron beam pattern generators. They are used e.g. to implement a pattern into the resist of a wafer, a mask or a wafer.

The electron sensor with electron sensor segments serves to detect the electrons of the primary electron beams with spatial resolution. The spatial resolution of the electron sensor is preferably given by the sizes of the segments of the electron sensor. The segments of the electron sensor preferably are detector cells that are arranged at fixed locations on the electron sensor. They may be picture elements (pixel) of pixel detectors like Charge Coupled Device (CCD) detectors or Active Pixel Sensors (APS). They may also be other elements defined by patterns on the electron sensor that are given by stripes or implantations on the electron sensor. They may also be any other electron sensor segments that are able to generate independent signals from each other when hit by electrons of the primary electron beams.

In another preferred embodiment, the segmentation of the electron sensor is one-dimensional, e.g. like for a linear CCD or a semiconductor strip detector. One-dimensional electron sensors simplify sensor complexity, sensor control, and data evaluation significantly while measurements of positions and cross sections of the primary electron beam are still possible. By applying sequentially increasing deflecting fields of deflecting deflectors to the primary electron beams, positions and cross sections and currents of all primary electron beams of a two-dimensional electron beam source array can be determined.

The at least one anode serves to direct the primary electron beams towards the electron sensor by means of an electric field. The term anode is to be understood in a broad sense. The at least one anode can be any electrode that is at a defined electric potential relative to the corresponding electron beam source and that serves to direct the primary electron beams towards the electron sensor. Anodes may be e.g. deflectors, the support structure of the non-transparent specimen and preferably the electron sensor itself.

The electric potential of the at least one anode relative to the corresponding electron beam sources determines the energy of the electrons of the primary electron beams when they impinge on the non-transparent specimen. The energy of the electrons in turn determines the wavelength of the electron beam which in turn limits the spatial resolution at which the specimen can be probed or structured. The wavelength of the electrons of the electron beams further determines the focus depth at the upper surface of the specimen. Finally, the energy of the electrons of the primary electron beams at the final foci determines the depth at which the non-transparent specimen is probed or structured. Preferably the energy of the electrons of the primary electron beams at the final foci is in the range between 0.1 keV and 100 keV and preferably in the range between a few hundred eV and 40 keV, depending on the kind of specimen and the kind of application. In some applications, e.g. the probing of biological non-transparent specimens or the structuring of very thin upper surface layers, it is preferred to have the energy of the electrons of the primary electron beams below 15 keV and even below 500 eV.

The multiple electron beam device according to claim 3 comprises focussing components to generate final foci with final focus lengths. The focussing preferably serves to improve the spatial resolution for probing or structuring the surface of the non-transparent specimen. The focus lengths are called final focus lengths since they are parameters of the final foci that probe or structure the non-transparent specimen. Since the specimen is non-transparent, the primary electron beams end on the upper surface of the specimen when it is probed or structured.

Preferably, the focussing components comprise individually focussing components to control the final focus lengths of the primary electron beams individually. Individually focussing components are able to focus a single primary electron beam independent from the others. Examples for electron multiple beam devices with individually focussing components are electron multiple beam devices with microcolumns. Another example is a multiple electron beam device with a field emission cathode array with individual gate electrodes for each field emission cathode. By applying individual voltages to each gate electrode the final focus lengths of each primary electron beams can be changed or adjusted individually.

Preferably, the multiple electron beam device comprises a support structure to place the non-transparent specimen into the primary electron beams. Preferably the support structure is such that the non-transparent specimen can be placed in and out of the primary electron beams as a routine matter. As a routine matter implies that placing a non-transparent specimen into the primary electron beams and out of the primary electron beams is one of the procedures that an operator of the multiple electron beam device can do on a regular basis, e.g. more than once per hour and preferably more than once every 10 minutes.

Preferably the support structure comprises means to place a non-transparent specimen into the multiple electron beam device at a well-defined position relative to the electron sensor. Preferably, the support structure is such that the same non-transparent specimens can be placed into the primary electron beams repeatedly into the same position. This way the upper surface distance is known without measuring it each time that a specimen is placed into the primary electron beams. The upper surface distance is needed for determining the primary electron beam positions and the final focus lengths from position measurements with the electron sensor.

Preferably, the support structure provides means that the upper surface of the non-transparent specimen facing the primary electron beams is coplanar to the electron sensor, when the non-transparent specimen is placed into the primary electron beams. This way, the upper surface distance is a constant value over the surface region that is to be probed or structured. Preferably, the support structure holds the non-transparent specimen into the primary electron beams in a way that the upper surface distance is known within the range of 100 μm and preferably within the range of 10 μm. Preferably, the support structure holds the non-transparent specimen into the primary electron beams that its upper surface is coplanar with the plane of segments of the electron sensor. Preferably, the coplanarity makes the upper surface distance constant within 100 μm, preferably within 10 μm and even more preferred within 2 μm over the region of the non-transparent specimen that is to be probed or structured.

Preferably, the multiple electron beam device comprises at least one secondary detector to detect secondary particles generated by the primary electron beams at the upper surface region of the non-transparent specimen. Secondary particles are the particles that the primary electron beams generate when they strike the upper surface of the non-transparent specimen. Secondary particles are electrons scattered back from the primary electron beams, as well as electrons or photons generated when primary electron beams strike the non-transparent specimen. Therefore the secondary detector preferably is capable of detecting electrons, photons or both depending on the purpose of the electron multiple beam device. Scanning electron microscopes for example comprise at least one secondary detector to detect secondary particles. With the detectors detecting the secondary particles an image of the upper surface of the non-transparent specimen can be generated with high spatial resolution.

The secondary detector for the secondary particles is preferably positioned between the electron beam sources and the non-transparent specimen in order to be able to detect the secondary particles generated or scattered at the upper surface of the non-transparent specimen. At the same time, the at least one secondary detector is preferably standing out of the way of the primary electron beams in order to not inhibit probing or structuring of the non-transparent specimen by the primary electron beams.

Preferably the multiple electron beam device comprises a control unit to read electronic signals from the electron sensor segments. Preferably, the control unit determines what electron sensor segments are hit by primary electron beams. Preferably, the control unit knows the positions of the segments that are hit by primary electrons. Preferably, the known positions of the segments are used to determine the positions of the primary electron beams on the electron sensor. Preferably, the control unit translates the signals of the electron sensor segments into the information at what positions the primary electron beams hit the electron sensor. Preferably, the control unit derives from this information the primary electron beam positions on the plane of the upper surface of the non-transparent specimen when the non-transparent specimen is placed into the primary electron beams for probing or structuring. To do this, the control unit preferably has access to the information how the non-transparent specimen upper surface is positioned geometrically with respect to the positions of the electron sensor segments.

Preferably, the measurements of the positions of the primary electron beams on the electron sensor are used to determine lateral distances between neighboring primary electron beams. Preferably, the distances between neighboring primary electron beams are measured with a relative precision to better than 50%, preferably to better than 20% and even more preferred to better than 5%. Preferably, the segments of the electron sensor are so small that they can resolve the cross sections of the incoming primary electron beams on the electron sensor to better than 50%, preferably better than 20% and even more preferred to better than 5%. The determination of the cross sections is preferably used to determine the final focus lengths of the primary electron beams.

Preferably, the control unit counts the number of electron sensor segments that are hit by a primary electron beam. Preferably the control unit translates this number into the size of the cross section on the electron sensor of that primary electron beam. Preferably, the control unit generates from this information the final focus length of the primary electron beam.

Preferably, the control unit determines the electron beam current of a primary electron beam from the electronic signals of the electron sensor segments. This information preferably is derived from the signal amplitudes coming from electron sensor segments.

The control unit preferably comprises several pieces of hardware and software. Preferably, the control unit comprises at least one processing unit to do the calculations that are necessary to calculate the primary electron beam positions and the final focus lengths from electronic signals of the segments of the electron sensor. Preferably the control unit also comprises some memory device where a calibration map can be stored. The calibration map preferably contains data relating operational parameters of the multiple electron beam device with positions of the primary electron beams on the electron sensor.

Preferably, the control unit controls the electric or magnetic fields of the at least one anode and/or focussing components to adjust the primary electron beam positions to desired primary electron beam positions. Preferably, the control unit further controls the electric or magnetic fields of the at least one anode and/or focussing components to adjust the final focus lengths to desired final focus lengths. Preferably, the control unit is equipped with a predetermined algorithm and preferably with a calibration map which helps to generate the potentials or magnetic fields necessary to move the primary final focus positions to desired final focus positions. This way, the primary electron beams can be adjusted to desired positions automatically, which is important when hundreds, thousands or even millions of primary electron beams are generated by a field emission cathode array.

Preferably, the control unit controls the individually focussing components to adjust the final focal lengths of the primary electron beams individually to desired final focus lengths. This is preferably done by adjusting the voltages of the gate electrodes of each electron beam source of a field emission cathode array individually. Preferably, such gate electrodes are integrated onto the substrate carrying the electron beam source array.

In one preferred embodiment, the electron sensor is firmly connected to the electron multiple beam device. The term "firmly" refers to the fact that the electron sensor can remain at its position within the multiple electron beam device when changing from probing or structuring a non-transparent specimen to the calibration of the multiple electron beam device or vice versa. Preferably, the electron sensor is placed behind the position which is foreseen for a non-transparent specimen during probing or structuring its surface (as seen in the direction of the primary electron beams). This way, the electron sensor can remain in its position independent of whether the non-transparent specimen is being probed or structured or whether the multiple electron beam device is being calibrated. Being able to leave the electron sensor within the multiple electron beam device increases the reproducibility for the measurements of the primary electron beam positions and final focus lengths.

In another preferred embodiment, the electron sensor is movable. Preferably, the electron sensor is moved when changing from probing or structuring the surface of a non-transparent specimen to calibrating the multiple electron beam device or vice versa. When changing to the calibration of the electron multiple beam device, the electron sensor preferably is moved to take on the position of the non-transparent specimen which is foreseen for the non-transparent specimen during probing or structuring its surface. Preferably, said position of the electron sensor during calibration is such that the surface of the segments of the electron sensor coincides with the upper surface of the non-transparent specimen when the latter is probed or structured. This way, the positions of the primary electron beams impinging on the electron sensor are the same as the positions of the primary electron beams impinging on the non-transparent specimen. This embodiment simplifies the calculation of the position measurement of the primary electron beam positions impinging on the non-transparent specimen considerably. Also, distortions of the electric and magnetic field due to the absence of the non-transparent specimen during calibration may be reduced.

Preferably, the electron sensor is a semiconductor detector, preferably a Charged Coupled Device (CCD), an Active Pixel Sensor (APS) or a semiconductor strip detector. Semiconductor detectors have the advantages that they generate high electronic signals to incoming electrons, that they can be segmented to very fine structure sizes and that they can be integrated with amplifying or logic electronic circuitry in a compact fashion. CCDs have the advantages that they are freely available on the market with various parameters like pixel (segments) numbers, pixel sizes, readout speed, electronic noise and the like. In addition there are CCDs available with small dead areas between neighboring pixels, which further improves the spatial resolution capabilities.

APSs have similar spatial resolution capabilities; however each pixel (segment) of an APS can be addressed individually for read out. This allows to read out the pixels in parallel which increases the read out speed significantly. In addition addressing the pixels individually allows to read only those pixels which are of interest, which again speeds up the read out.

Preferably, the multiple electron beam device comprises a magnifying lens which is positioned between the electron sensor and the focussing components that generate the final foci. Preferably, the magnifying lens is placed behind the plane on which the non-transparent specimen is to be placed for probing or structuring its surface. The magnifying lens is preferably part of an electron beam optical system, that magnifies the lateral distances $D1$ between neighboring primary electron beams at the desired final focus positions to the lateral distances $D2$ between the same primary electron beams at the electron sensor. Preferably, the magnification factor D2/D1 is larger than the ratio of the pitch of the segments of the electron sensor to the pitch of neighboring electron beam sources. The magnification helps to improve the resolution for determining the primary electron beam positions and/or the final focus lengths.

Preferably, the magnifying lens is part of an electron beam optical system that magnifies the distances D1 by a factor larger than the ratio of the pitch of the segments of the electron sensor to the pitch of neighboring electron beam sources. This is the minimum magnification necessary to make sure that not more than one primary electron beam is striking one electron beam segment. It is also the minimum magnification necessary to make measurements of the cross sections of the primary electron beams. Preferably, the magnification is four times higher, and even more preferred ten times higher than the ratio mentioned above. The higher the magnification, the higher the spatial resolution for the measurements of the primary electron beam positions and the final focus lengths.

The invention according to claim 21 discloses a method to inspect multiple primary electron beams generated by a field emission cathode array of an electron multiple beam device. The method includes measuring positions of the multiple primary electron beams on the electron sensor. Preferably, the measurements are used to determine paths along which the primary electron beams run. Knowing the paths along which the primary electron beams run allows to determine the positions at which the primary electron beams impinge on a non-transparent specimen when it is placed into the primary electron beams at some well-defined position.

Determining positions of the multiple primary electron beams on the electron sensor is preferably performed when the non-transparent specimen is placed out of the primary electron beams. Preferably, the inspection of the multiple primary electron beams includes establishing a calibration map that relates operational parameters of the multiple electron beam device with the positions of the multiple primary electron beams on the electron sensor. With the calibration map it is possible to probe or structure the non-transparent specimen with high spatial resolution without having to measure the positions of the multiple primary electron beams on the electron sensor simultaneously.

Preferably, the primary electron beams are focussed to final foci by means of electric or magnetic focussing fields. The electric or magnetic focussing fields are preferably generated by focussing components and even more preferred by individually focussing components.

Preferably, the final focus lengths of the final foci are determined by counting the number of segments that are hit by the corresponding primary electron beam. As mentioned earlier, the number of segments of the electron sensor hit by a primary electron beam reflects the cross section of the primary electron beam on the electron sensor. The cross section on the electron sensor in turn can be used to determine the final focus lengths of the focussed primary electron beams.

Preferably, the final focus lengths of the primary electron beams are adjusted to desired final focus lengths by means of the electric or magnetic focussing fields. Preferably, the electric or magnetic focussing fields are generated by individually focussing components. Individually focussing components are able to focus each primary electron beam independent of the corresponding other primary electron beams. The adjustment is preferably performed by determining the desired segments of the electron sensor, i.e. the segments that would be hit by the primary electron beam with desired final focus length. Then, the final focus lengths are changed until the desired segments are hit. The desired segments can be derived from geometric calculations, e.g. by using the cross section of the primary electron beam at the plane of the focussing component generating the final foci and the distance between that plane and the electron sensor.

The invention according to claim 26 discloses a method to adjust final focus lengths of focussed multiple primary electron beams to desired final focus lengths. In one step, the number of segments hit by a corresponding primary electron beam is determined for each primary electron beam, which preferably serves to measure the final focus lengths of the primary electron beams. In another step, the final focus length of each primary electron beam is adjusted to a desired final focus length by changing the electric or magnetic focussing fields until a desired number of segments is hit by the corresponding primary electron beam.

Preferably, the electric or magnetic focussing fields are adjusted in a way that each primary electron beam hits a desired number of segments simultaneously. In this case, the primary electron beams are focussed to desired final focus lengths at the same time, which allows to operate the primary electron beams with desired final focus lengths in parallel. Preferably, the numbers of segments hit by the corresponding primary electron beams are equal for all primary electron beams.

Preferably, electric or magnetic focussing fields are generated by individually focussing components. Individually focussing components allow to focus the primary electron beams individually. This way it is possible to adjust each primary electron beam to a desired final focus length independent from the corresponding other primary electron beams. In particular, this way the final focus lengths can be adjusted such that the final focus positions come to lie on the upper surface of a non-transparent specimen. This in turn allows the best possible spatial resolution for probing or structuring a non-transparent specimen.

Preferably, the methods to inspect multiple primary electron beams, the method to adjust the final focus lengths of focussed multiple primary electron beams and the method to calibrate a multiple electron beam device are carried out with electron multiple beam devices according to any one of claims 1 to 20.

Preferably, data containing information of the electronic signals of the electron sensor segments are written onto a storage device. Such data preferably are used to establish the calibration map. They can also be used to later correct an image of the upper surface of the specimen probed by the primary electron beams. The data can also be used to observe drifts of the primary electron beam behavior over time at constant operational parameters of the electron multiple beam device.

Preferably, the lateral distances between neighboring primary electron beams, D1, are magnified by at least one magnifying lens. The magnifying lens is preferably a magnetic or electric lens. The magnification of the distance D1 increases the spatial resolution for the measurements of the positions of the primary electron beams on the electron sensor. It also increases the spatial resolution for the measurement of the final focus lengths. The larger the size of the segments of the electron sensor the larger the magnification needed to achieve a specified spatial resolution. Preferably, the magnification is larger than the ratio of the sizes of the segments with the corresponding lateral distances between neighboring primary electron beams, D1.

Preferably, the surface of the electron sensor segments is movable towards the upper surface of a non-transparent specimen. Preferably, in particular for inspection of the primary electron beams, adjusting the final focus lengths of the primary electron beams and/or for calibration, the surface of the electron sensor segments is moved such that it coincides with the plane of the upper surface of the non-transparent specimen during probing or structuring. This way, the measurements of the positions of the primary electron beams on the electron sensor agree with the positions where the surface of the non-transparent specimen is probed or structured thereafter or before. Also, adjusting the final focus positions of the primary electron beams on the surface of the non-transparent specimen is reduced to the task of finding the operational parameters that minimize the cross sections of the primary electron beams on the electron sensor.

Preferably, also the currents of the primary electron beams are measured by means of the electron sensor. Further, for each primary electron beam, the current of the primary electron beam is preferably adjusted to a desired current value.

BRIEF DESCRIPTION OF THE DRAWINGS

Some of the above indicated and other more detailed aspects of the invention will be described in the following description and partially illustrated with reference to the figures. Therein:

FIG. 1a shows a primary electron beam of a multiple electron beam device of the art impinging on the upper surface of a non-transparent specimen.

FIGS. 3a and 3b show schematically a multiple electron beam device according to the invention with the electron sensor in the calibration position (FIG. 3a) or the structuring position (FIG. 3b).

FIGS. 4a and 4b show schematically a multiple electron beam device according to the invention where calibration (FIG. 4a) and structuring (FIG. 4b) can be performed without having to move non-transparent specimen or electron sensor.

FIG. 5a shows final foci of focussed primary electron beams impinging on the segments of an electron sensor according to the invention.

FIG. 5b shows final foci of focussed primary electron beams impinging on the segments of an electron sensor after magnification according to the invention.

FIG. 6b shows a multiple electron beam device according to the invention, which can be calibrated with the method as shown in FIG. 5a.

DESCRIPTION OF THE PREFERRED EMBODIMENTS

Figure 1B:
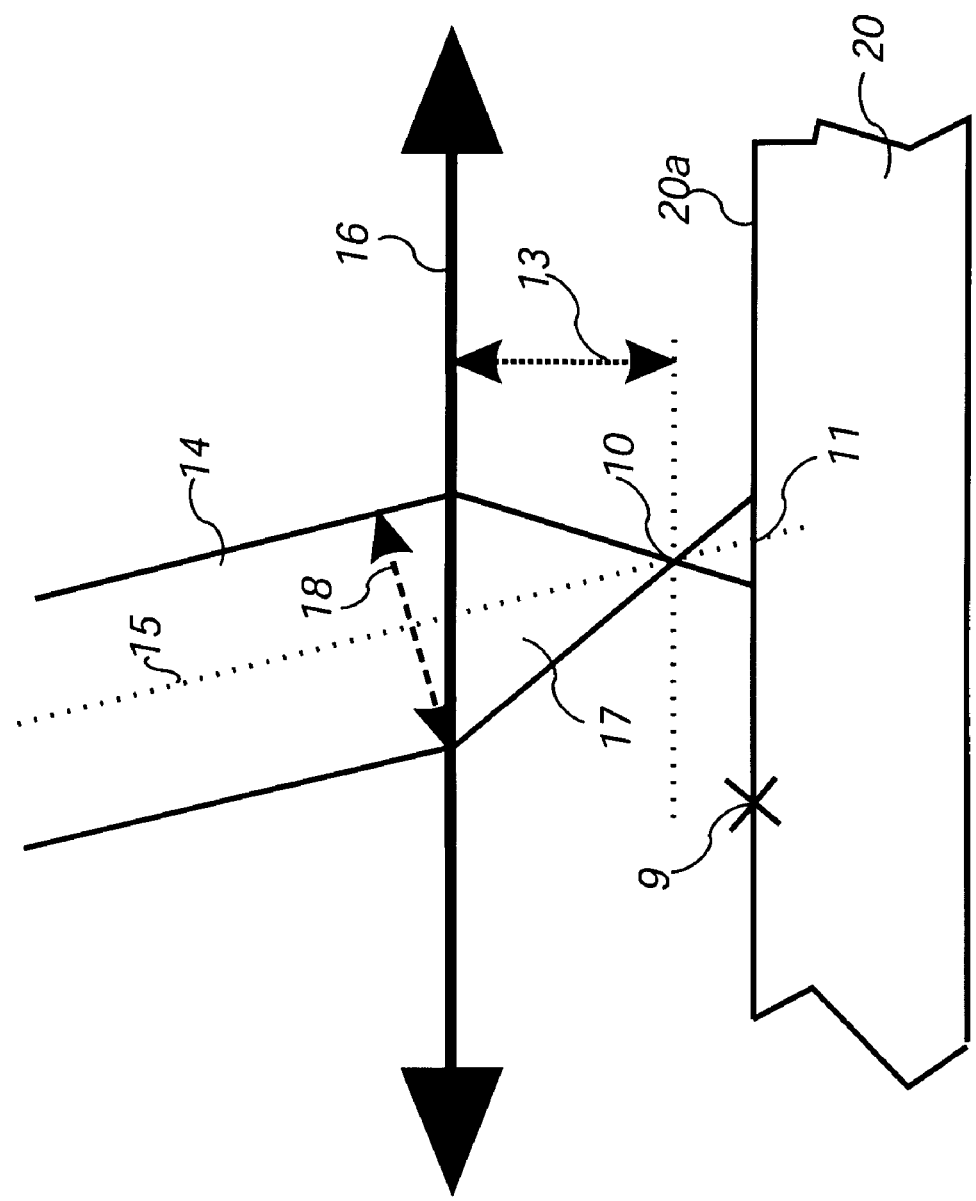
FIG. 1b shows a focussed primary electron beam of a multiple electron beam device of the art impinging on the upper surface of a non-transparent specimen.

FIGS. 1a and b show schematically primary electron beams 14 impinging on the upper surface 20a of a non-transparent specimen 20. The non-transparent specimen 20 in this embodiment is a silicon wafer. The thickness of the wafer 20 is typically between 100 µm and 2000 µm and preferably between 300 µm and 1000 µm. FIG. 1a relates to a non-focussed primary electron beam 14. The axis 15 of the primary electron beam 14 is essentially given as the line of midpoints of the cross sections 18 of the primary electron beam 14. The position of the primary electron beam 14 impinging on the non-transparent specimen 20 is given by the primary electron beam position 11. The primary electron beam position 11 is the point where the axis of the primary electron beam 15 crosses the upper surface of the non-transparent specimen 20a. The primary electron beam position 11 in FIG. 1a is deviating from a desired primary electron beam position 8, which in this example is on the surface of the non-transparent specimen 20a. It is one aspect of the present invention to provide means and methods to make sure that for probing or structuring the surface of a non-transparent specimen 20a, the primary electron beams 14 impinge on the non-transparent specimen 20 at the desired primary electron beam positions 8.

In FIG. 1b a primary electron beam 14 passes a focussing lens 16 to form a final focus 17 with the final focus position 10. The final focus position 10 is given by the final focus length 13 and the primary electron beam position 11. The final focus position 10 in FIG. 1b is deviating from the desired final focus position 9. The desired final focus position 9 lies on the surface of the non-transparent specimen 20a, which is advantageous for probing or structuring the non-transparent specimen 20 with the highest possible spatial resolution. It is a further aspect of the present invention to provide means and methods to make sure that for probing or structuring the surface of a non-transparent specimen 20a the primary electron beams 14 impinge on the non-transparent specimen 20 with desired final focus position 9.

Figure 2A:
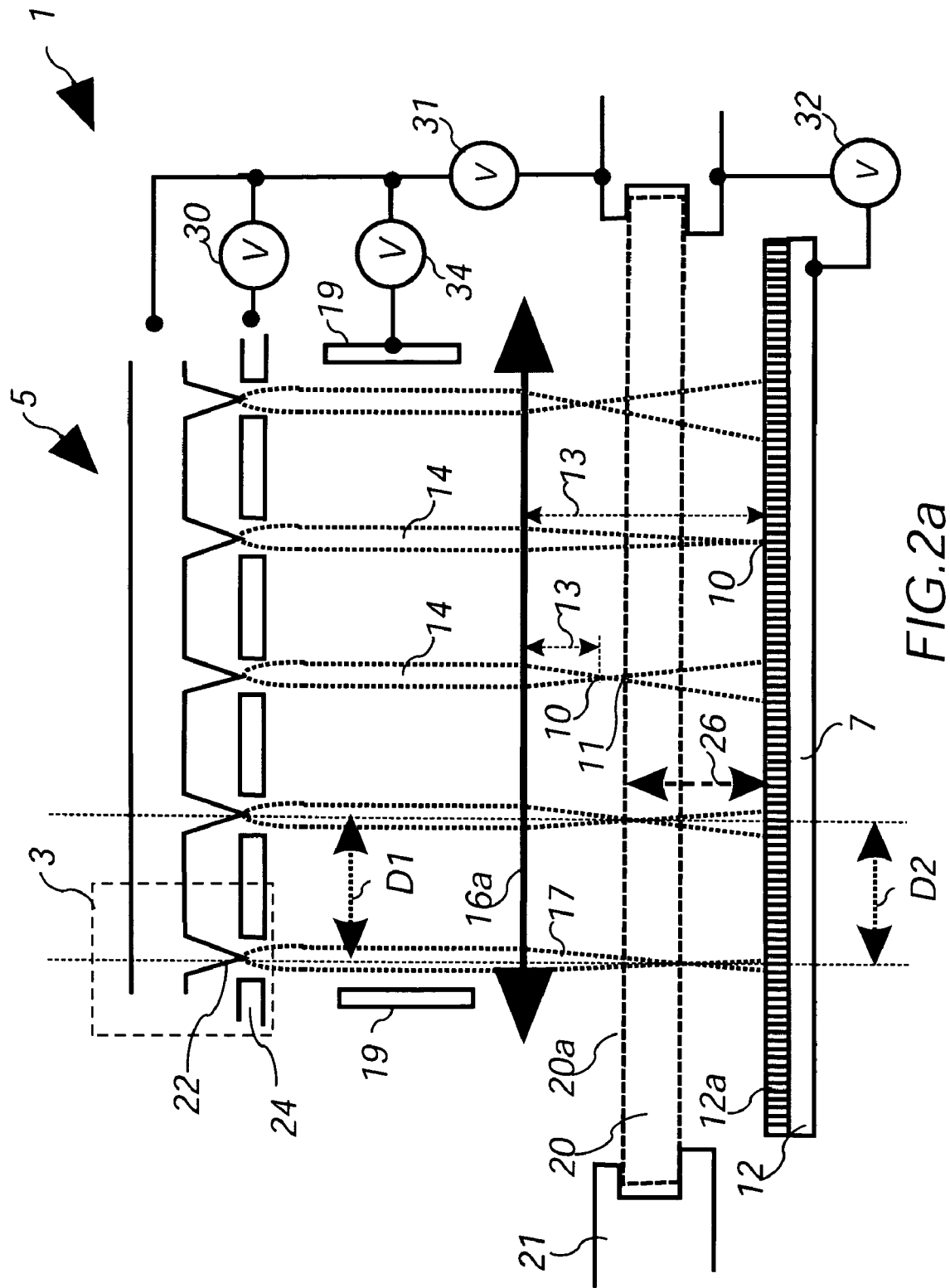
FIG. 2a shows schematically a multiple electron beam device according to the invention with focussed primary electron beams focussed by globally focussing elements.

In FIG. 2a a multiple electron beam device 1 is shown during calibration. During calibration, the non-transparent specimen 20 is placed out of the primary electron beams 14. Therefore, the primary electron beams 14 impinge on the segments 12a of the electron sensor 12. The non-transparent specimen 20, which in this embodiment is a silicon wafer, is only drawn as a dashed line to visualize the surface 20a of the non-transparent specimen 20 that is to be structured after calibration.

FIG. 2a further shows primary electron beams 14 deflected by a globally deflecting deflector 19 and focussed by globally focussing component 16a with a final focus length 13. For simplicity of argument the following description of the multiple electron beam device 1 is confined to the description of the multiple electron beam device 1 as a device to structure the upper surface of a non-transparent specimen 20a. However, it is known to persons skilled in the art that a multiple electron beam device according to the invention can also be used to probe the upper surface of a non-transparent specimen, which is e.g. using the multiple electron beam device as a scanning electron microscope with multiple electron beams.

In this embodiment, the multiple electron beam device 1 is used for direct writing a structure into the upper surface of a silicon wafer 20 for fabrication of a wafer with an integrated electronic circuit. Again it is known to persons skilled in the art that the multiple electron beam device 1 according to the invention also can be used to structure non-transparent specimens other than silicon wafers, e.g. biological materials, ceramic materials, wafers other than those made of silicon.

Structuring the surface of the silicon wafer 20a is carried out by directing the primary electron beams 14 to the desired positions that are to be structured. Since in FIG. 2a the primary electron beams 14 can be only deflected globally not all primary electron beams can be at desired positions at the same time. In particular some primary electron beams may be pointing to positions on the surface of the silicon wafer which are not meant to be structured. For that reason it is foreseen that there is an electronic circuitry attached to the electron beam sources to switch the electron beam currents individually on and off on demand.

To structure a desired pattern into the surface of the silicon wafer 20a a sequence of operational parameters of the multiple electron beam device has been loaded into an electronic memory of the multiple electron beam device 1 (not shown in FIG. 2a), which helps to guide the primary electron beams 14 to the various positions on the silicon wafer 20 that are to be structured. The operational parameter sequence is preferably based on a calibration map that relates operational parameters of the multiple electron beam device 1 to the corresponding primary electron beam positions 11 on the silicon wafer 20, final focus lengths 13 and primary electron beam currents of the primary electron beams. The calibration map had been generated during a calibration procedure before the wafer was placed into multiple electron beam device for structuring the pattern.

In one preferred embodiment, the operational parameter sequence is such that it adjusts the final focus lengths 13 such that the final focus positions 10 come to lie on the surface of the silicon wafer 20a in order to structure the surface of the silicon wafer 20 with the highest possible spatial resolution. The operational parameter sequence preferably adjusts the primary electron beam currents to a same current value to improve the homogeneity by which the primary electron beams 14 structure the silicon wafer upper surface 20a. The operational parameter sequence further preferably takes compensating measures to avoid artifacts in the pattern on the surface of the silicon wafer 20a caused by electron beam sources 3 that are malfunctioning or dead.

In order to establish the operational parameter sequence of the electron multiple beam device, the final focus lengths 13 and the primary electron beam positions 11 with respect to the electron sensor had been measured for given sets of operational parameters of the electron multiple beam device. Preferably, also the distances between primary electron beam positions 11 of neighboring primary electron beams 14 on the electron sensor for given sets of operational parameters had been measured, before the wafer 20 had been placed into the multiple electron beam device 1.

In order to structure the surface of the silicon wafer 20a in a well determined way, the multiple electron beam device 1 of FIG. 2a comprises an array of electron beam sources 3, which is a field emission cathode array 5. Each electron beam source 3 comprises an emitter tip 22 and an extracting electrode 24. The current of the electron beam source 3 is preferably controlled by a first voltage 30, which is applied between the emitter tip 22 and the extracting electrode 24. Preferably, the first voltage 30 can be applied for each electron beam source individually to control the current of each electron beam source 3 individually. Such individual control of the currents allows to switch each electron beam source on and off individually.

Preferably the field emission cathode array 5 of FIG. 2a is integrated onto a semiconductor substrate. An example of a integrated field emission cathode arrays is described e.g. in U.S. Pat. No. 5,977,719, which is hereby incorporated by reference. An integrated design allows to integrate hundreds, thousands or even millions of electron beam sources onto a substrate of the size of roughly a thumbnail. Field emission cathode arrays of such high integration density can be manufactured with micromechanical manufacturing techniques known in the art. The high integration density allows to probe or structure a specimen with many primary electron beams in parallel to increase the throughput for probing or structuring a specimen. In FIG. 2a, the distance between neighboring emitter tips 22 is smaller than 1000 µm, preferably smaller than 100 µm and even more preferred smaller than 10 µm.

The primary electron beams 14 are directed and focussed by means of the anode 7, the globally deflecting deflector 19 and the globally focussing component 16a. In this embodiment the anode 7 is essentially the electron sensor 20, which is at a positive voltage with respect to the emitter tips 22. The positive voltage in FIG. 2a is determined by the sum of the second voltage source 31 and the third voltage source 32. The final foci 17 are being formed by the globally focussing components 16a. The final foci 17 are the foci of the primary electron beams 14 that are meant to structure the upper surface of the silicon wafer 20a. The distance between the field emission cathode array 5 and the anode 7 in this embodiment is preferably smaller than 100 mm, preferably smaller than 20 mm and even more preferably smaller than 10 mm.

The globally focussing components 16a apply to the primary electron beams simultaneously. They are preferred for their simplicity of use, since especially with highly integrated electron beam sources, it is difficult to implement focussing components that focus each primary electron beam individually. However, inhomogeneities of the globally focussing component 16a, inhomogeneities of the energies of the primary electron beams 14 and the like may lead to inhomogeneities of the final focus lengths 13 within the array of primary electron beams 14, as indicated in FIG. 2a. Since a global focussing component 16a cannot eliminate inhomogeneities of all final focus lengths 13 at the same time, it is impossible to adjust all final focus positions 10 onto the surface of the silicon wafer 20a at the same time. Instead, the globally focussing components 16a focus the primary electron beams 14 in a way that all final focus positions 10 are at least close to the surface of the silicon wafer 20a In FIG. 2a, the electron sensor 12 is positioned behind the silicon wafer 20 in order to not be in the way of the primary electron beams 14 when the silicon wafer 20 is placed into the primary electron beams 14. The electron sensor 12 in this embodiment is a Charged Coupled Device (CCD). Therefore, the electron sensor segments 12a in FIG. 2a-c correspond to the pixels (picture elements) of the CCD. However, other types of electron sensors are possible as well to perform the position measurement, like e.g. Active Pixel Sensors (APS) with readout electronics on each pixel, silicon strip detectors, arrays of photo diodes or the like. The advantages of a CCD are their high degree of segmentation (i.e. the small pixel size), the high sensitivity to ionizing radiation, the high degree of integration and their commercial availability. The sizes of the rectangular pixels 12a of CCDs are usually smaller than 20 µm at each side, preferably smaller than 8 µm at each side and even more preferred smaller than 5 µm at each side.

The detection of the positions of incoming primary electron beams impinging on a CCD by means of the CCD and a CCD-readout system is known to persons skilled in the art and will only be briefly described here. Each pixel 12a of the CCD 12 that is hit by electrons of a primary electron beam 14 generates electron-hole pairs that can be detected. CCD-readout systems are capable of detecting in which pixel 12 the electron-hole pairs are generated. Therefore, the CCD 12 in combination with the CCD-readout system is capable of detecting which pixel 12a has been hit by a primary electron beam 14.

If a primary electron beam 14 impinges on only one pixel 12a of the CCD 12, the spatial resolution of the measurement of the position of the primary electron beam striking the CCD 12 is given by the size of the pixels 12. If the primary electron beam 14 impinges on more than one pixel 12a of the CCD 12, the spatial resolution of the measurement of the position of the primary electron beam striking the CCD 12 can be improved by interpolation, e.g. calculating the center of gravity of the primary electron beam 14 by summing up the signal amplitude of the pixels 12a that are hit by the primary electron beam 14. There are many other methods known in the art that are used to determine the position of an electron beam impinging on a pixel device like the CCD.

It is known that CCDs suffer from smearing images when they are exposed to the primary electron beams during CCD readout. The smearing of the images deteriorates the precision to which the primary electron beam positions can be measured. To avoid smearing, a mechanical shutter may be placed in front of the CCD 12 in order to cover the CCD 12 at the time of readout. Alternatively, the CCD 12 may be equipped with a design that protects the pixels 12a from the primary electron beams 14 when the CCD 12 is read out.

FIG. 2a also shows a support structure 21 which is used to place the silicon wafer 20 into the primary electron beams 14. The support structure 21 is important for the calibrations of the primary electron beams since it defines the position of the silicon wafer 20 with respect to the electron sensor 12. In particular, the support structure defines the upper surface distance 26, i.e. the distance between the electron sensor 20 and the upper surface of the silicon wafer 20a along the primary electron beam directions. The choice of the upper surface distance 26 influences the cross sections of the primary electron beams 14 on the electron sensor 12 and therefore the precision of the measurement of the final focus length 13. Preferably, the upper surface distance 26 is smaller than 5000 μm and preferably smaller than 1000 μm.

Deviations of the upper surface distance 26 from wafer to wafer preferably are smaller than 100 μm and preferably smaller than 2 μm. In FIG. 2a, the silicon wafer 20 is clamped between an upper and a lower clamp of the support structure 21. Since the silicon wafer 20 is planar within a few micrometers, the upper clamp of the support structure 21 determines the position of the upper surface of the wafer 20a within a few micrometers.

When the silicon wafer 20 is taken out of the primary electron beams 14 the support structure 21 gives way to the primary electron beams 14 to let them impinge on the electron sensor 12. Preferably, the support structure also provides some means that the silicon wafer 20 is tightened to the support structure 21 in order that the silicon wafer 20 is not unintentionally moving during operation by more than 10 μm and preferably by more than 1 μm.

Preferably, the support structure 21 also provides means for moving the silicon wafer 20 in and out of the way of the primary electron beams 14 as a routine matter. Since the multiple electron beam device 1 shown in FIG. 2a is meant to structure silicon wafers with high throughput, i.e. more than 10 wafers per hour, it is important that the support structure can move the silicon wafers in or out of the primary electron beams 14 in less than a few minutes, preferably in less than a minute. Preferably, the support structure 21 is moving the wafer in or out remotely, since this operation is preferably done at high vacuum (better than $10^{-6}$ mbar or preferably better than $10^{-8}$ mbar) at the wafer.

The rate at which calibration measurements, i.e. the establishing of a calibration map, are performed depends on the quality of the electron multiple beam device, the spatial resolution needed for a given application and the wear of the field emission cathode array 5 or the globally focussing component 16a. In one preferred embodiment the calibration is performed once a new field emission cathode array 5 is installed in the multiple electron beam device 1. In another preferred embodiment, the calibration is performed each time that a new operational parameter sequence, e.g. for a new structuring pattern, has to be established. Preferably the calibration is performed in time intervals depending on the rate at which silicon wafers are structured by the multiple electron beam device 1. For very high precision, calibration measurements are carried out each time that a single silicon wafer is to be structured.

A calibration of the multiple electron beam device 1 of FIG. 2a includes determining the operational parameters of the multiple electron beam device for given measured primary electron beam positions 11 on the electron sensor 12. Preferably, calibration also includes determining the operational parameters of the multiple electron beam device for given measured final focus lengths 13 or for given measured electron beam currents. Preferably, the calibration of the multiple electron beam device 1 of FIG. 2a also includes adjustments of the final focus lengths 13 to desired final focus lengths, whereby a calibration map is established that relates the desired final focus lengths with the operational parameters that produce the desired final focus lengths. Preferably, the calibration of the multiple electron beam device 1 of FIG. 2a also includes adjustments of the electron beam currents to desired electron beam currents, whereby a calibration map is established that relates the desired electron beam currents to the operational parameters that produce the desired electron beam currents.

The measurement of the primary electron beam positions 11 is performed by detecting the pixels 12a that are hit by the primary electron beams. Knowing the upper surface distance 26, the primary electron beam positions 11 can be determined from simple trigonometric reasoning. Preferably, also the angle at which the primary electron beams 14 strike the electron sensor 12 are known to calculate the primary electron beam positions 11 with even higher precision. If primary electron beam positions 11 deviate from desired primary electron beam positions, the operational parameter sequence of the multiple electron beam device has to include compensating instructions that stop the deviating primary electron beam from structuring the silicon wafer 20 at the wrong position, e.g. by individually switching off the primary electron beam current of the corresponding field emission cathode 3.

Because focussing of the primary electron beams 14 of the multiple electron beam device of FIG. 2a includes only globally focussing components 16a, the adjustment of the final focus lengths 13 cannot be done individually to desired final focus lengths. Instead only an adjustment to a global best final focus length is possible. An adjustment to a best final focus length is performed by measuring the individual final focus lengths 13 of the primary electron beams 14. Then, according to an specified algorithm, parameters of the globally focussing component 16a are changed until a best global final focus length is provided. The definition of a best global final focus length depends on the application. Preferably the best global final focus length is reached when the sum of the deviations of the final focus lengths from the desired final focus lengths is minimized. In FIG. 2a, the desired final focus length is given by the distance from the plane of the globally focussing component 16a to the upper surface of the silicon wafer 20a.

The measurements of the final focus lengths 13 of the primary electron beams 14 are performed by detecting the number of pixels 12a that are hit for each primary electron beam 14. The number of pixels 12a hit by a primary electron beam reflects the cross section of the primary electron beam 14 on the CCD 12. The cross section of the primary electron beam 14 on the CCD 12 in turn is a measure of the final focus length 13. E.g. it can be seen from FIG. 2a that if the final focus length 13 of a primary electron beam 14 is short, the number of segments 20a of the electron sensor 12 hit by that primary electron beam 14 is large compared to primary electron beams with longer final focus length 13.

Since it is not possible to determine the final focus length 13 of a primary electron beam 14 that strikes only one pixel 12a, it is important to have the pitch of the pixels 12 small enough that several pixels 12a are hit by an incoming primary electron beam 14. Alternatively, the CCD 12 can be moved away in a vertical direction from the globally focussing lens 16a to increase upper surface distance 26. An increased upper surface distance effectively broadens the cross section of the primary electron beams 14 on the electron sensor 12, which improves the spatial resolution of the primary electron beam position at a given pixel pitch. On the other hand, the upper surface distance 26 should not be too large in order to avoid neighboring primary electron beams 14 overlapping on the CCD 12. Preferably, the upper surface distance 26 is below 5000 µm and preferably below 1000 µm.

The adjustment of the primary electron beam currents to a desired primary electron beam current is performed by measuring the primary electron beam currents and then adjusting the first voltage 30 between extracting electrodes 24 and the corresponding emitter tips 22 for each electron beam source 3. The primary electron beam currents are measured with the CCD 12. Each primary electron beam generates signals in the pixels 12a whose amplitude is directly correlated to the number of electrons per time unit that arrive on the pixel 12. Therefore, the primary electron beam current of a primary electron beam 14 can be determined by summing up the signals of the pixels 12a that the primary electron beam 14 is striking.

The primary electron beam positions 11 are measured relative to each other by measuring the lateral distances D2 between neighboring primary electron beams at the CCD 12. The lateral distances D2 are determined by measuring the primary electron beam positions of the two neighboring primary electron beams on the CCD 12. The primary electron beam positions of the two neighboring primary electron beams on the CCD 12 are measured by detecting the pixels 12a that are hit by the two primary electron beams 14. If a primary electron beam 14 hits more than one pixel 12a, the midpoint of the pixels is determined e.g. by taking the mean position weighted by the signal height of the pixels. Possible deviations of the distances D2 between neighboring primary electron beams from desired values are preferably documented on some data storage device. They are also used as input for a calibration map and/or for establishing the operational parameter sequence in order to include compensating measures to avoid artifacts of the pattern on the silicon wafer 20.

Preferably, the directions of the primary electron beams 14 arriving at the CCD 12 run in parallel within 5° and preferably within 1°. Preferably, the upper surface of the silicon wafer 20a is coplanar to the upper surface of the CCD 12 such, that the upper surface distance 26 varies by less than 100 µm and preferably by less than 10 µm over the surface 20a of the wafer 20. In this case, the distances D2 between neighboring primary electron beams on the CCD 12 are the same as the distances D1 on the upper surface of the silicon wafer 20a. If however the primary electron beams 14 do not arrive in parallel, additional corrections have to be made in order to determine the distances D1 from the measured values of the distances D2. The necessary steps to take for the necessary corrections however depend on the details of an application and are known to people skilled in the art.

Figure 2B:
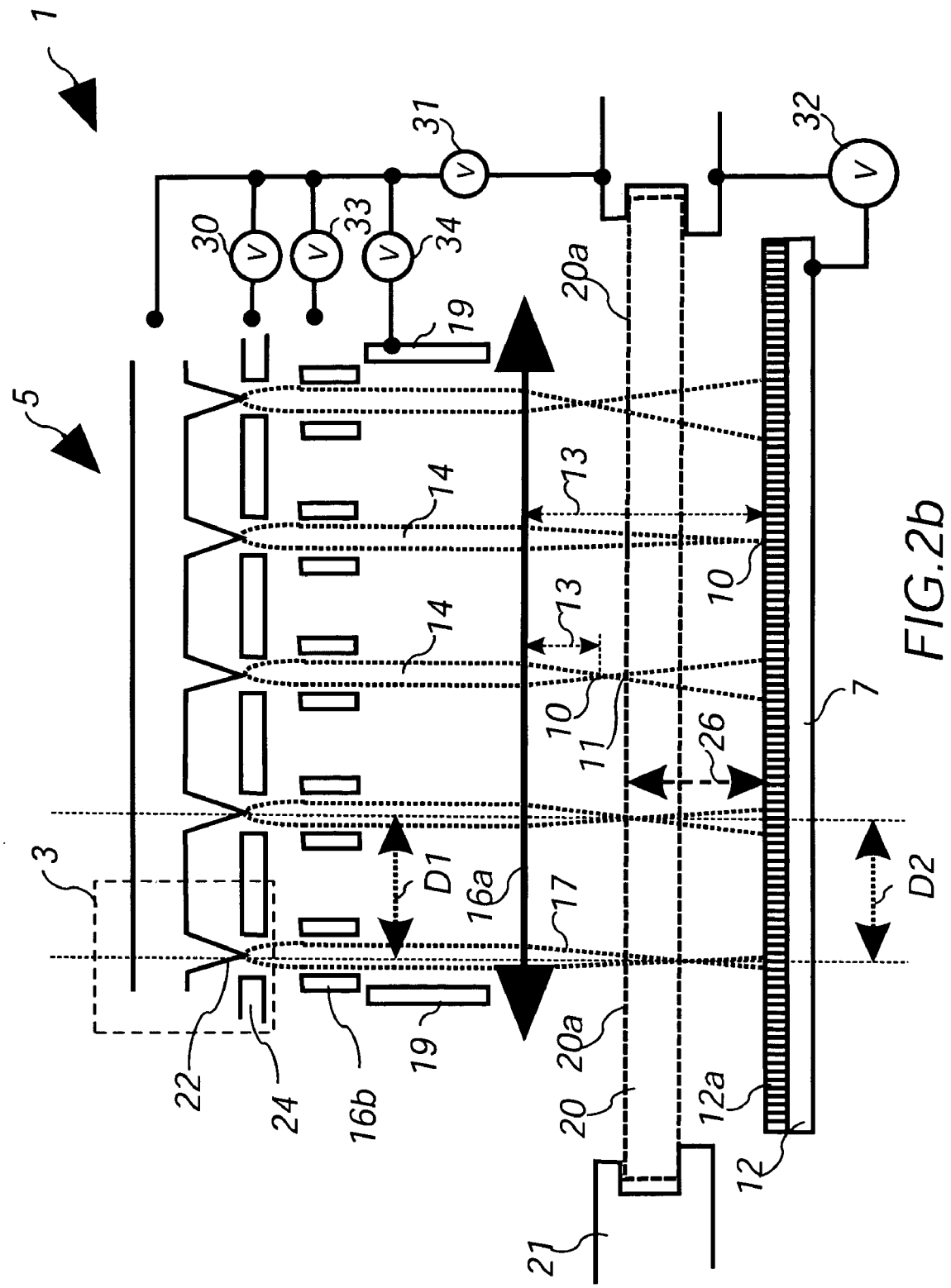
FIG. 2b shows schematically a multiple electron beam device according to the invention with focussed primary electron beams focussed by individually focussing elements.

In FIG. 2b a multiple electron beam device 1 similar to the one in FIG. 2a is shown. The main difference is that the multiple electron beam device 1 in FIG. 2b comprises individually focussing components 16b. The individually focussing components 16b allow the final focus lengths 13 of each primary electron beam 14 to be adjusted individually. This in turn allows the primary electron beams 14 to be focussed individually on the upper surface of the silicon wafer 20a. This way the spatial resolution for structuring the surface of the silicon wafer 20a is improved.

The individually focussing components 16b in FIG. 2a are preferably realized as gate electrodes 16b which are connected to fourth voltages 33 which for each gate electrode are individually adjustable. By means of the fourth voltages 33 the electric fields along the path of the primary electron beams can be individually changed in a way that the final focus lengths 13 of each primary electron beam is varied in one or the other direction.

Preferably, the gate electrodes 16b are integrated on the field emission cathode array 5. Field emission cathode arrays 5 with integrated gate electrodes 16b are e.g. described in U.S. Pat. No. 5,977,719. The design of a field emission cathode array 5 with integrated gate electrodes allows the gate electrodes 16b individually to be contacted to fourth voltage sources 33 in a compact and reliable fashion. With such devices, primary electron beams 14 are focussed to cross sections at the final focus position 10 that are smaller than 500 nm, preferably smaller than 100 nm and even more preferred smaller than 20 nm. The focussing depth of such beams is preferably in the range between 0.5 µm and 5 µm.

Figure 2C:
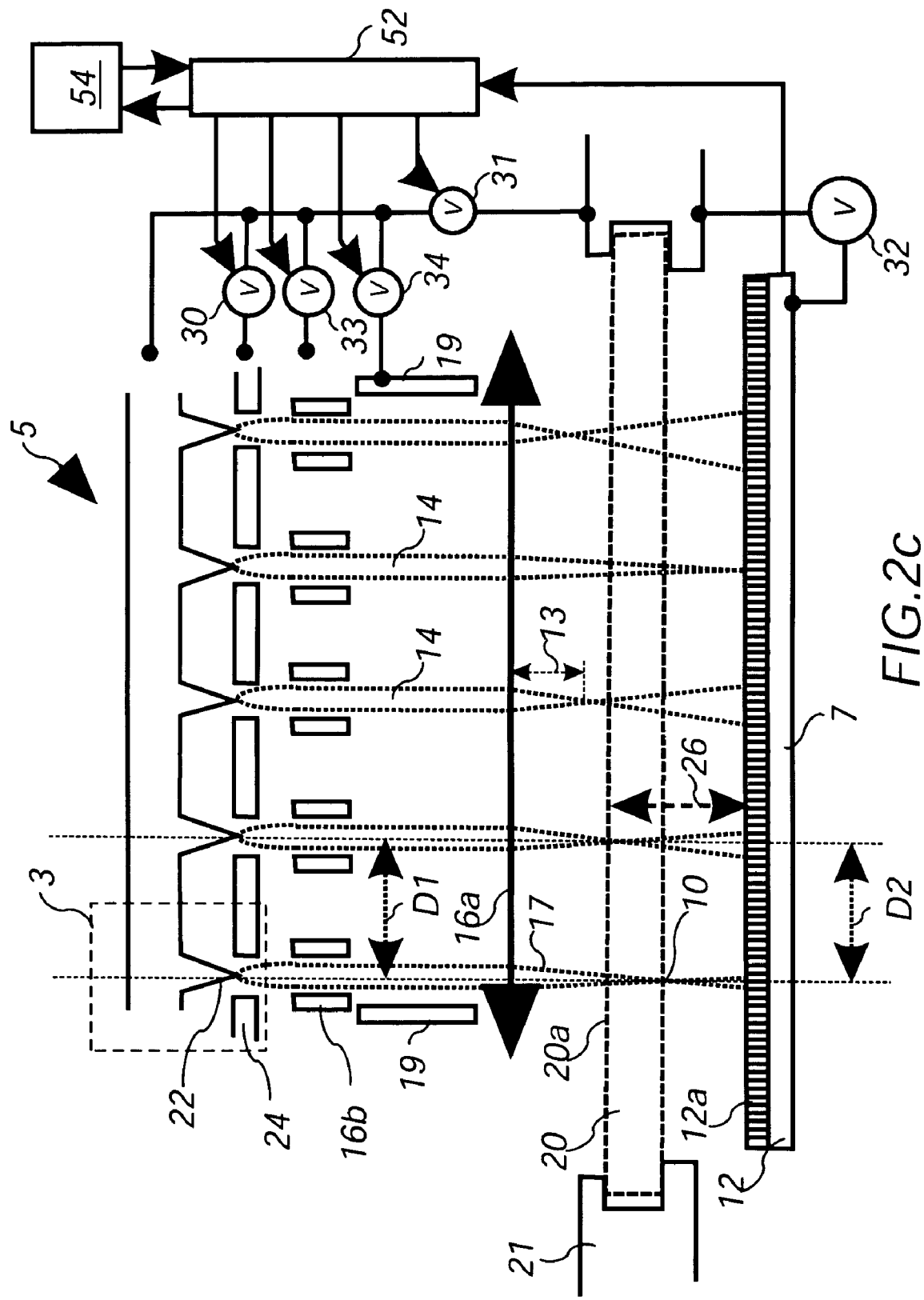
FIG. 2c shows schematically a multiple electron beam device according to the invention with focussed primary electron beams focussed by individually focussing elements and a control unit to control the final focus lengths.

In FIG. 2c, a multiple electron beam device 1 like in FIG. 2b is shown, with the difference that the multiple electron beam device 1 comprises a control unit 52. During calibration, the control unit 52 reads the signals from the CCD 12 to determine the primary electron beam currents, the primary electron beam positions 11 on the CCD 12 and the final focus lengths 13. The control unit 52 further changes the first, second, third, fourth and fifth voltages, 30, 31, 32, 33 and 34, to adjust the primary electron beam currents to desired primary electron beam currents, the final focus lengths 13 to the desired final focus lengths and the primary electron beam positions 11 to the desired primary electron beam positions. The desired final focus positions thereby lie on the surface of the silicon wafer 20a when placed into the primary electron beams 14.

Once desired primary electron beam positions, desired currents and desired final focus lengths of the multiple primary electron beams have been adjusted, the corresponding operational parameters of the multiple electron beam device 1, in particular the first, second, third, fourth and fifth voltages, 30, 31, 32, 33 and 34, are read from the corresponding voltage supplies and written to an electronic storage device (e.g. RAM) together with said desired positions, currents and final focus lengths. The data written to the electronic storage device are part of a calibration map that is used to determine a sequence of operational parameters to structure a desired pattern on the surface of wafer 20.

Figure 3B:
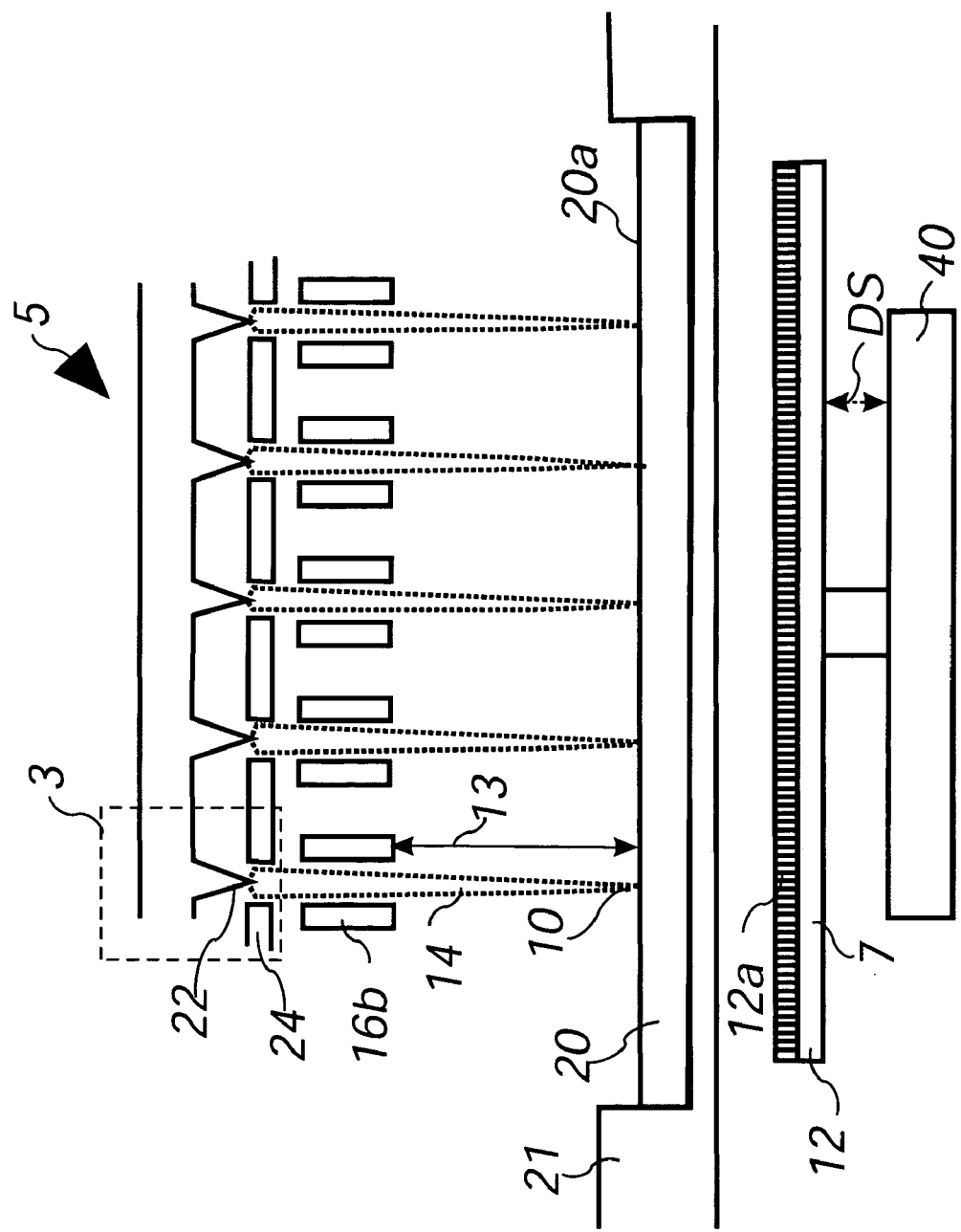

FIG. 3a and FIG. 3b show another embodiment of a multiple electron beam device 1 according to the invention. In this embodiment, the electron sensor 12 is movable. FIG. 3a shows the multiple electron beam device 1 during calibration with the electron sensor 12 having taken on the position of the wafer 20 during structuring. The primary electron beams 14 impinge on the electron sensor and are being inspected, changed or adjusted. The wafer 20 is placed out of the primary electron beams 14. FIG. 3b shows the multiple electron beam device 1 in the structuring mode with the electron sensor 12 removed in order let the primary electron beams 14 impinge on the surface of the wafer 20a. While in FIG. 3a and FIG. 3b, the non-transparent specimen 20 is a semiconductor wafer, the multiple electron beam device 1 also applies to non-transparent specimens other than wafers.

The multiple electron beam device 1 generates primary electron beams 14 via field emission cathode array 5 with emitter tips 22 and extraction electrodes 24. The primary electron beams 14 are further individually focussable via individually focussing components 16b, which in this embodiments are gate electrodes integrated onto the field emission cathode array 5. The gate electrodes 16b generate final foci with focal lengths 13 and final focus positions 10.

In the calibration mode, the wafer 20 is placed out of the primary electron beams, while the distance DS between a stepping motor 40 and electron sensor 12 is increased in order to make the electron sensor 12 replace the wafer 20 at the wafer position. Preferably, the distance DS is increased to the level that the plane of the segments 12a of the electron sensor 12 coincides with the plane that the upper surface of the wafer 20a takes on during structuring the wafer 20. This way, the positions of the primary electron beams 14 measured on the electron sensor 12 are virtually identical to the primary electron beam positions 11 on the wafer 20 during structuring the wafer 20. In the calibration position, the plane of the segments of the electron sensor 12a deviates vertically by less than preferably 100 μm and even more preferred by less than 10 μm or even 2 μm from the plane of the upper surface of the wafer 20a if it were in the structuring position, i.e. the upper surface distance 26 is preferably smaller than 100 μm and even more preferred smaller than 10 μm.

The direct transfer of the position measurements made with the electron sensor 12 to the positions on the surface of the wafer 20a makes the position measurement procedure less complicated and reduces the error of the position measurements. In addition, the presence of the electron sensor 12 at the position where the wafer is during structuring can be used to reduce the error of electron beam position due to electrical distortions caused by the absence of the wafer 20 during calibration. In addition, the adjustment of the final focus lengths 13 for highest possible spatial resolution for structuring the wafer 20 is reduced to the problem of finding the smallest cross sections of the primary electron beams 14 on the electron sensor 12.

Once the calibration is finished, the electron sensor 12 is removed from its position to allow wafer 20 to be placed into the primary electron beams, 14 at the position where the electron sensor 12 was during calibration (FIG. 3b). Preferably, the electron sensor 12 is removed from its calibration position by reducing the distance DS between electron sensor 12 and stepping motor 40. This way, the electron sensor 12 has to be moved by a distance of only little more than the thickness of the wafer 20. A short distance for removal of the electron sensor 12 is preferred to improve precision and reproducibility of the positioning of the electron sensor 12 when it is moved back and forth between calibration position and structuring position.

As mentioned above, the placement of the wafer 20 into the primary electron beams 14 for structuring has to be made precisely in order to minimize the uncertainty of the upper surface distance 26. In FIG. 3b, the precision is achieved by the support structure 21 which holds the wafer 20 and which is moved out of the primary electron beams 14 with the wafer 20 during calibration. Preferably, the support structure 21 supports the wafer 20 also on the reverse side of the wafer 20 in order to avoid the wafer 20 bending under its own weight.

Figure 4A:
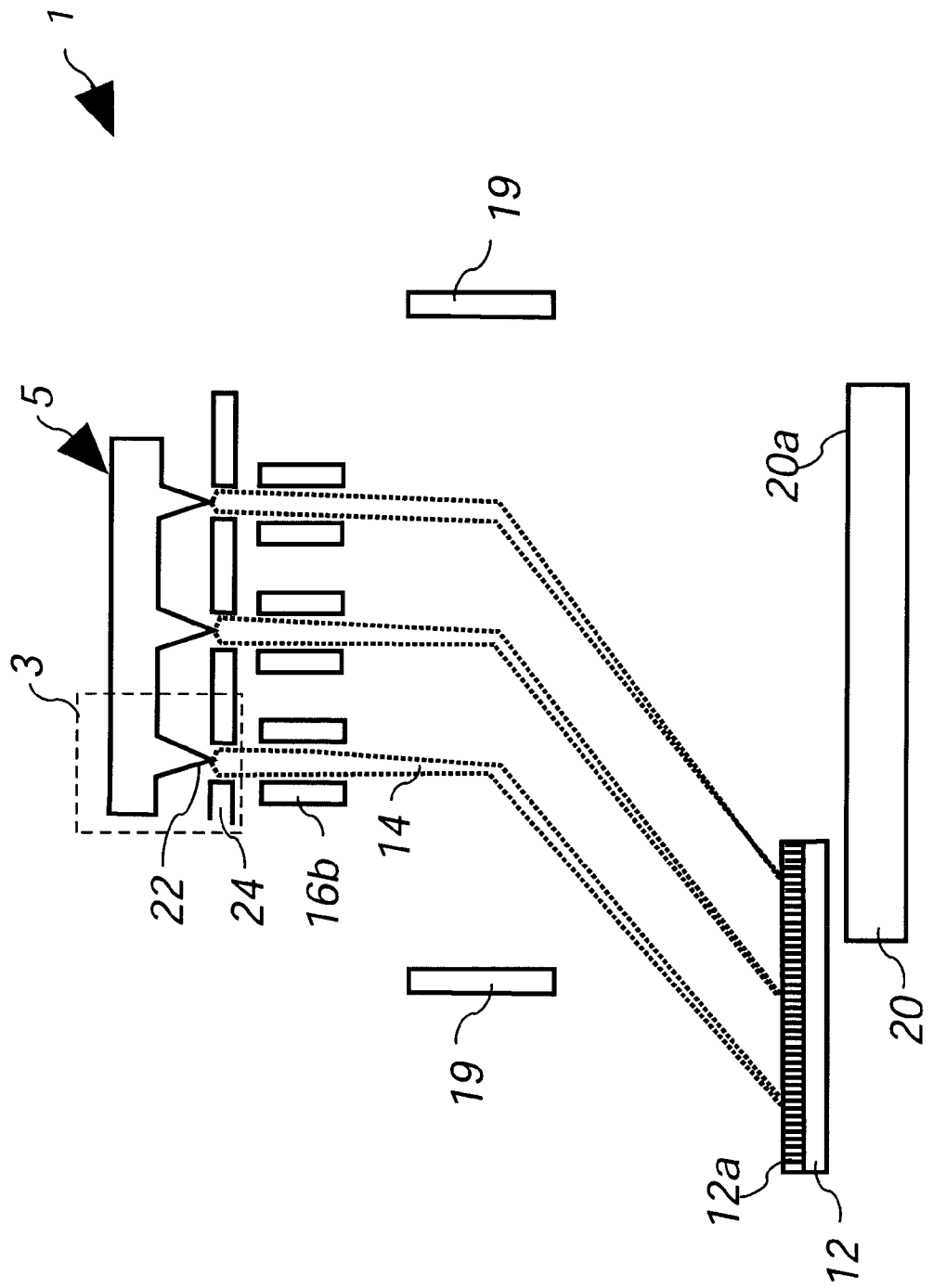

FIG. 4a and FIG. 4b further show another embodiment of the invention. In this embodiment, calibration and structuring of the wafer 20 can be carried out without having to move non-transparent specimen 20 and electron sensor 12 when switching from calibration mode to structuring mode or vice versa Instead, in order to start a calibration, a globally deflecting deflector 19 deflects the primary electron beams 14 out of the region of the non-transparent specimen 20 to the region of the electron sensor 12. Not having to move either non-transparent specimen 20 or electron sensor 12 between calibration and structuring is advantageous because position errors due to mechanical movements of non-transparent specimen 20 or electron sensor 12 are eliminated. In addition, it takes little time to switch between calibration mode and structuring mode, since only the deflecting field of the globally deflecting deflector 19 has to be changed. Fast switching between calibration and structuring modes allows to check the functionality of the electron multiple beam device 1 and to inspect the primary electron beams 14 on short call, thereby improving the overall performance of the multiple electron beam device.

In FIG. 4a, the deflecting field strength of the globally deflecting deflector 19 is increased from a specified low level to a specified high level in order to deflect the primary electron beams 14 away from wafer 20 to the region of the electron sensor 12. In this position, final focus positions 10, final focus lengths 13 and currents of each primary electron beam 14 can be measured in ways as described before. Since strength and direction of the high level deflecting field are known, the measurements of final focus positions 10 and final focus lengths 13 of the primary electron beams 12 by means of the electron sensor 12 can be used to determine final focus positions 10 and final focus lengths 13 of the primary electron beams when the deflecting field is switched back from specified high level to the specified low level. This way, final focus positions 10 and final focus lengths 13 of the primary electron beams 14 can inspected and adjusted.

FIG. 4b shows the same multiple electron beam device 1 with the deflecting field reduced to the specified low level. With low level deflecting field, the primary electron beams 14 impinge on wafer 20 in order to structure its upper surface 20a. In order to scan the primary electron beams 14 over a region of the upper surface of the non-transparent specimen 20a, either the wafer 20 is moved horizontally or the deflecting field of the globally deflecting deflector 19 is varied within a low level.

Preferably, the vertical distance between electron sensor 12 and wafer 20 is as small as possible in order that both the segments of the electron sensor 12a and the upper surface of the wafer 20a can be scanned with high spatial resolution at a similar final focus lengths. On the other hand, the vertical distance is preferably large enough that wafer 20 can be moved underneath the electron sensor without changing its vertical distance to the field emission cathode array S. Preferably, the vertical distance between electron sensor 12 and wafer 20 is smaller than 5000 μm and even more preferred smaller than 1000 μm.

FIGS. 5a and b show in more detail focussed primary electron beams 14 striking the electron sensor 12, which in this embodiment is a CCD 12 with pixels 12a. The final focus positions 10 of the final foci 17 can be individually adjusted by means of the individually focussing components 16b. The non-transparent specimen 20 is preferably a semiconductor wafer. FIG. 5a and FIG. 5b represent the situation in the calibration mode, i.e. the wafer 20 is placed out of the primary electron beams 14 in order to let the primary electron beams 14 impinge on the electron sensor. Instead, only a line is drawn to indicate where the surface of the wafer 20a runs when the wafer is placed into the primary electron beams for structuring. In this preferred embodiment, the surface of the silicon wafer 20a is coplanar with the electron sensor within 3° and preferably within 1°, implying that also the line 20a runs parallel with the plane of the segments 12a of the electron sensor.

Preferably, the primary electron beams 14 run in directions essentially parallel to each other, with angles smaller than 10° and preferably smaller than 3°. Therefore, within the limits of being parallel, the distance D2 between neighboring primary electron beams as measured on the e sensor 12 is equal to the distances D1 on the surface of the silicon wafer 20a.

In this embodiment, the electron sensor 12 is firmly tightened to the multiple electron beam device 1, i.e. the electron sensor 12 does not move back and forth when changing from calibration mode to structuring mode, thus providing higher reproducibility for position measurements of the primary electron beams 14 over time. In addition, the requirement for a high segmentation is less stringent since with the electron sensor 12 out of the plane with desired final focus positions, the cross sections of the primary electron beams on the electron sensor 12 are larger than on the surface of the wafer 20a.

In order to achieve highest possible spatial resolution for structuring the wafer 20, the final focus lengths 13 of the primary electron beams 14 are preferably adjusted in a way that the final focus positions 10 come to lie on the line 20a As can be seen from FIG. 5a, the different final focus lengths 13 of the three primary electron beams 14 result in different cross sections D3 of the primary electron beams 14 on the electron sensor 12. The number of segments 12a of the electron sensor (i.e. the number of pixels of a CCD 12) hit by a primary electron beam 14 therefore is a relative measure by how much a final focus length 13 deviates from a desired final focus length. Measuring the number of pixels that are hit by a primary electron beam 14 therefore allows the final focus length 13 to be adjusted to a desired final focus length 13.

The primary electron beam positions 11, which are the positions of the primary electron beam at the line 20a, are determined by calculating the center of the measured cross sections D3 on the electron sensor 12. Preferably, the primary electron beam positions 11 are such that the distances between neighboring primary electron beams at the desired final focus positions D1 are equal. Equal distances between neighboring primary electron beams D1 make it easier to scan the many primary electron beams 14 simultaneously over the surface 20a of the wafer, in order to structure the surface of the wafer 20a with a desired pattern.

For many applications however, the spatial resolution of segmented electron sensors 12, like CCDs, is too low in order to determine the distances D1 between neighboring primary electron beams and the final focus positions 11 with the required precision. For example, there are field emission cathode arrays 5 available with a spacing between their field emission cathodes 3 of less than 10 μm. Electron multiple beam devices with such field emission cathode arrays often need to determine the primary electron beam positions 11 to a precision better than 1 μm. However, pixels of CCDs are hardly smaller than 4 μm and would not be able to resolve the primary electron beam positions 11 with such precision. In addition, the precision of measuring the cross sections of the primary electron beams 14 with a CCD 12 with a pitch of 4 μm as given by the pixel size would be low, making it difficult to determine the final focus lengths 13 of the primary electron beams 14.

FIG. 5b shows a set-up to meet high precision standards for the spatial resolution of the primary electron beam positions 11. In FIG. 5b, a magnifying lens 50 is placed between the plane representing the surface of the wafer 20a during structuring and the electron sensor 12, which again is a CCD. The magnifying lens can be an electric lens, a magnetic lens or a combination of both. The magnifying lens 50 projects the lateral distances D1 of neighboring primary electron beams at the final focus positions 10 to the larger distances D2 on the plane of the CCD 12. The magnification is given by the ratio D2/D1. This ratio can be adjusted by changing the focal length FL of the magnifying lens or changing the distance between magnifying lens 50 and the CCD 12. The magnification of the magnifying lens 50 is preferably larger, and even more preferred four times larger, than the ratio of the pitch of the pixels of the CCD 12 and the pitch of neighboring field emission cathodes 3 of the field emission cathode array 5. This way, it is possible to separate primary electron beams 14 on the CCD 12 and to determine the final focus positions 11 and final focus lengths 13 with high resolution.

Figure 6A:
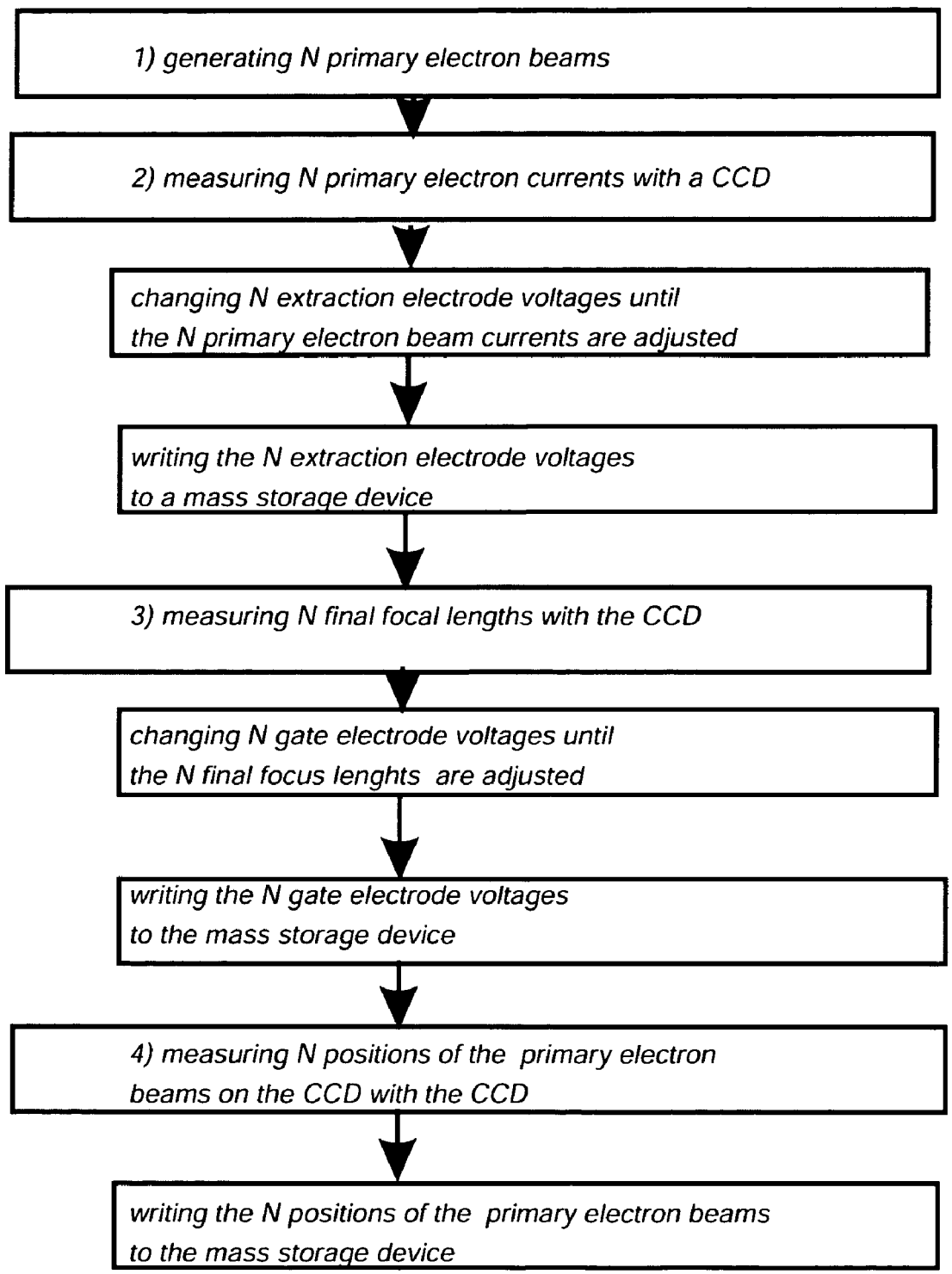
FIG. 6a shows a method to calibrate a multiple electron beam device according to the invention with a multiple electron beam device as shown in FIG. 5b.
Figure 6B:
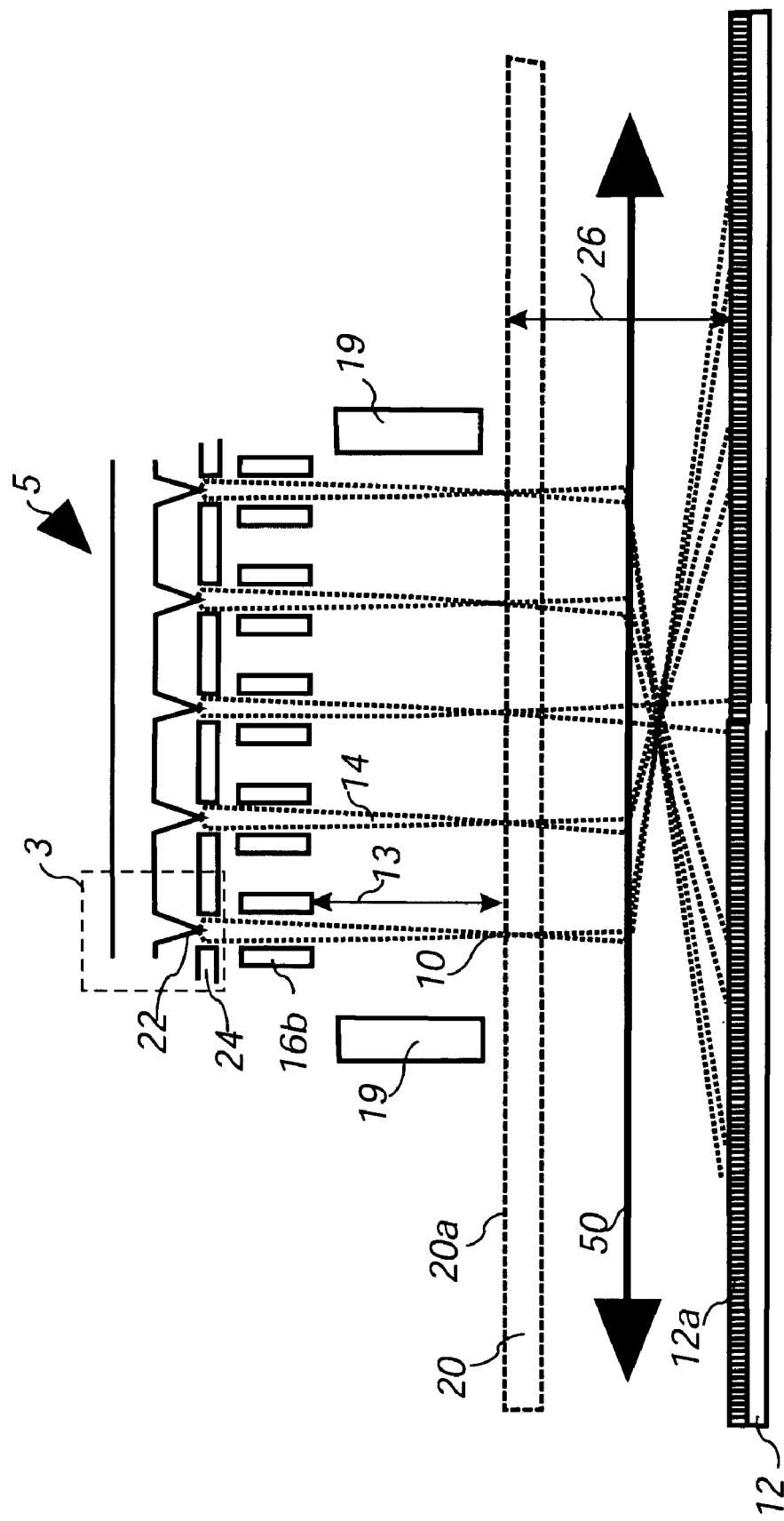

FIG. 6a describes schematically a calibration procedure for a multiple electron beam device as shown in FIG. 6b. The multiple electron beam device 1 of FIG. 6b is similar to the one in FIG. 3b. The multiple electron beam device 1 comprises a field emission cathode array 5 with N field emission cathodes 3. Each field emission cathode 3 comprises an emitter tip 2, an extracting electrode 24 and a gate electrode 16b for focussing the corresponding primary electron beam 14 individually. Preferably, the field emission cathode array 5 is a highly integrated device with more than N=100, preferably more than N=1000 and even more preferred more than N=100,000 field emission cathodes 5. The distances between neighboring field emission cathodes 5 preferably is less than 1000 μm and even more preferred less than 100 μm. The field emission cathodes 5 are designed to emit primary electron beams 14 with currents in the range between 100 pA to 100 nA and preferably between 1 nA and 10 nA. The primary electron beams 14 are focussed by the gate electrodes 16b to foci with a cross section of less than 1000 nm and preferably less than 100 nm at the final focus position 10.

Preferably, the electron sensor 12 is a CCD with a pitch between neighboring pixels of less than 10 μm each. The CCD 12 is placed behind the plane of where during structuring the upper surface 20a of the wafer 20 comes to lie. In addition a magnifying lens 50 is placed in front of the CCD 12. The magnifying lens 50 is of the type as shown in FIG. 5b. It is designed to magnify the lateral distances D1 between neighboring primary electron beams. The magnification factor is chosen to be such that the cross section of a primary electron beam 14 on the CCD 12 covers at least 4 pixels in diameter when the primary electron beam 14 is focussed correctly onto the plane of the surface 20a of the wafer 20. The magnifying is necessary to measure the final focus lengths 13 of the primary electron beams with sufficient resolution.

The multiple electron beam device 1 further comprises a globally deflecting deflector 19 which is designed to deflect the primary electron beams 14 simultaneously by the same deflection angle. The globally deflecting deflector 19 is used to scan the primary electron beams 14 over the surface 20a of wafer 20 in order to structure the wafer surface 20a after calibration.

The calibration of the type as shown in FIG. 6a proceeds as follows: in a first step, N primary electron beams 14 are generated and directed towards the CCD 12. Since the wafer 20 is placed out of the primary electron beams 14 during calibration, the primary electron beams 14 pass through the magnifying lens 50 to impinge on the CCD 12 at initial primary electron beam positions with initial final focus lengths and currents.

In a second step, the currents of the N primary electron beam are measured individually and in parallel by the CCD 12. Methods to measure electron beam currents with a CCD are well-known to people skilled in the art. They are based on measuring the ionization per time interval caused by each primary electron beam 14 in the pixels 12a on which they impinge.

The measured primary electron beam currents are individually compared to desired primary electron beam current values and adjusted when necessary. The adjustment of the N primary electron beam currents is carried out by changing the voltages of the corresponding N extracting electrodes 24 until the desired current values are reached. E.g. the primary electron beam current of a field emission cathode 3 is increased by increasing the voltage between the corresponding emitter tip 22 and extracting electrode 24, and lowered by lowering the same voltage.

Once the desired current values of the N primary electron beam have been adjusted, the operational parameters that deliver those currents, in particular the voltages of emitter tip 22 and extracting electrode 24 of each field emission cathode 3, are written onto some electronic storage device. The data are part of a calibration map that relates the current values of the primary electron beams 14 with the operational parameters of the multiple electron beam device 1 that generate the measured current values. The calibration map is used at a later stage to generate primary electron beams with the desired current values for structuring a wafer surface 20a without having to monitor them.

In a third step, the final focus lengths 13 of the N primary electron beams 14 are measured. The measurements are carried out with the operational parameters of the multiple electron beam device 1 that delivered the desired primary electron beam currents. The final focus length 13 of a primary electron beam 14 is given by the distance between the focussing gate electrode 16b and the final focus position 10. The measurement of the final focus lengths 13 is carried out by measuring the cross section of the primary electron beams on the CCD 12, i.e. by counting the pixels 12a that a primary electron beam 14 hits on the electron sensor 12. The relation between the number of pixels 12a hit by a primary electron beam 14 and the corresponding final focus positions 10 results from simple geometric considerations, as they are explained in the description of FIG. 5b.

Once the final focus lengths 13 are measured, their values are individually compared with the desired final focus lengths and adjusted when necessary. The adjustment of the N final focus lengths 13 is carried out by changing the voltages of the corresponding N focussing gate electrodes 24 until the desired final focus lengths 13 have been generated.

After the adjustment of the N final focus lengths 13, the operational parameters that deliver those final focus lengths 13, in particular the voltages of focussing gate electrodes 16b, are written onto the electronic storage device. Again, the data are part of a calibration map that relates the final focus lengths 13 of the primary electron beams 14 with the operational parameters of the multiple electron beam device 1 that generate the measured final focus lengths. The calibration map is used at a later stage to generate primary electron beams with the desired final focus lengths 13 for structuring a wafer surface 20a without having to monitor them.

In a fourth step, the N primary electron beam positions on the CCD 12 are measured. The measurement is preferably carried out with the operational parameters of the multiple electron beam device 1 that have produced the desired primary electron beam currents and the desired final focus lengths 13. The measurements of the N positions of the primary electron beams 14 on the CCD 12 can be used to determine the primary electron beam positions 11 on the surface 20a of the wafer, since the upper surface distance 26, i.e. the distance between CCD 12 and upper surface of the wafer 20a during structuring, is known. After measuring the N positions of the primary electron beams 14 on the CCD 12, their coordinates (or equivalent parameters describing the positions of the primary electron beams 14 on the CCD or the wafer surface 20a) are written onto the electronic storage device. Again, the data are part of a calibration map that relates the primary electron beam positions 11 of the primary electron beams 14 with the operational parameters of the multiple electron beam device 1 that generate the measured position values. The calibration map is used at a later stage to generate primary electron beams with the desired primary electron beam positions 11 for structuring a wafer surface 20a without having to monitor them.

In the embodiment of the multiple electron beam device as shown in FIG. 6b, it is not possible to adjust the primary electron beam positions individually to desired positions. The array of primary electron beam positions on the CCD 12 (or on the wafer surface 20a when it is placed into the primary electron beams 14) may be deviating from a regularly distributed array with equal distances between neighboring primary electron beams 14. However the knowledge of the deviations helps to compensate such deviations when the primary electron beams 14 are scanned via a globally deflecting deflector over the surface of a wafer 20a.

There are many other procedures possible to calibrate electron multiple beam devices according to the invention. The calibration procedure depends on the kind of electron multiple beam device, on the precision needed and on the application for which the calibration is carried out. The calibration described here represents only an example for many other calibration procedures which are equivalent and within the scope of the present invention.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this application to particular combinations of features, it should be understood that the scope of the disclosure of the present application includes any and every novel feature or any novel combination of features disclosed herein either explicitly or implicitly and any generalization thereof, whether or not it relates to the same invention as presently claimed in any claim and whether or not it mitigates any or all of the same technical problems as does the present invention.

The invention claimed is:

1. A multiple electron beam device for probing or structuring a non-transparent specimen with primary electron beams, comprising:
    a field emission cathode array to generate multiple primary electron beams;
    an electron sensor with several electron sensor segments per primary electron beam of the multiple primary electron beams to directly detect electrons of the primary electron beams individually without having to move
    (a) said electron sensor;
    (b) said specimen, or
    (c) said electron sensor and said specimen; and
    at least one anode to direct the primary electron beams towards the electron sensor.

2. A multiple electron beam device according to claim 1, comprising focusing components to focus the primary electron beams with final focus lengths.

3. A multiple electron beam device for probing or structuring a non-transparent specimen with focused primary electron beams, comprising:
    an array of electron beam sources to generate multiple primary electron beams;
    an electron sensor with several electron sensor segments per primary electron beam of the multiple primary electron beams to directly detect electrons of the primary electron beams individually without having to move
    (a) said electron sensor,
    (b) said specimen, or
    (c) said electron sensor and said specimen; and
    at least one anode to direct the primary electron beams towards the electron sensor;
    focusing components generating final foci with final focus lengths.

4. The multiple electron beam device according to claim 1, comprising individually focused components to control the final focus lengths of the primary electron beams individually.

5. The multiple electron beam device according to claim 1, comprising a support structure to place the non-transparent specimen into the primary electron beams.

6. The multiple electron beam device according to claim 1, comprising at least one secondary detector to detect secondary particles generated by the primary electron beams at the upper surface of the non-transparent specimen.

7. The multiple electron beam device according to claim 1, comprising a control unit to read electronic signals from the electron sensor segments.

8. The multiple electron beam device according to claim 7, wherein the control unit determines what electron sensor segments are hit by a primary electron beam.

9. The multiple electron beam device according to claim 7, wherein the control unit counts the number of electron sensor segments that are hit by a primary electron beam.

10. The multiple electron beam device according to claim 7, wherein the control unit determines the electron beam current of a primary electron beam from the electronic signals of the electron sensor segments.

11. The multiple electron beam device according to claim 7, wherein the control unit controls the electric or magnetic fields of the focusing components and/or the at least one anode to adjust the primary electron beam positions to desired primary electron beam positions.

12. The multiple electron beam device according to claim 7, wherein the control unit controls the electric or magnetic fields of the individually focusing components to adjust the final focal lengths of the primary electron beams to desired final focus lengths individually.

13. The multiple electron beam device according to claim 7, wherein the control unit adjusts currents of individual primary electron beams to desired currents.

14. The multiple electron beam device according to claim 3, wherein the array of electron beam sources is a field emission cathode array and preferably a field emission cathode array integrated on a semiconductor substrate.

15. The multiple electron beam device according to claim 14, wherein the individually focusing components are integrated onto the field emission cathode array.

16. The multiple electron beam device according to claim 1, wherein the electron sensor is directly connected to the multiple electron beam device.

17. The multiple electron beam device according to claim 1, comprising a magnifying lens which is positioned between the electron sensor and the focusing components that generate the final foci.

18. The multiple electron beam device according to claim 17, wherein the magnifying lens is part of an electron beam optical system that magnifies the lateral distances D1 between neighboring primary electron beams by a factor larger than the ratio of the pitch of the segments of the electron sensor to the pitch of neighboring electron beam sources.

19. The multiple electron beam device according to claim 1, wherein the electron sensor is a semiconductor sensor, preferably a Charged Coupled Device (CCD) or an Active Pixel Sensor (APS).

20. The multiple electron beam device according to claim 1, wherein the multiple electron beam device is a scanning electron microscope detecting (SEM) or an electron pattern generator.

21. A method to inspect multiple primary electron beams generated by a field emission cathode array of a multiple electron beam device, comprising:
    providing a multiple electron beam device with a field emission cathode array;
    generating the multiple primary electron beams by means of the field emission cathode array;
    directing the multiple primary electron beams towards an electron sensor with electron sensor segments; and
    measuring positions of the multiple primary electron beams individually on the electron sensor by determining positions of the electron sensor segments that are directly hit by the multiple primary electron beams without having to move
(a) said electron sensor,
(b) said specimen, or
(c) said electron sensor and said specimen.

22. A method to calibrate a multiple electron beam device for probing or structuring a non-transparent specimen, comprising:
providing a multiple electron beam device with an array of electron beam sources;
generating multiple primary electron beams by means of the electron beam sources;
directing the multiple primary electron beams towards an electron sensor with electron sensor segments;
measuring positions of the multiple primary electron beams individually on the electron sensor by determining positions of the electron sensor segments that are directly hit by the multiple primary electron beams without having to move
(a) said electron sensor,
(b) said specimen, or
(c) said electron sensor and said specimen; and
generating a calibration map relating the measured positions of the multiple primary electron beams to the electron sensor with operational parameters of the multiple electron beam device that direct the primary electron beams to said measured positions on the electron sensor.

23. The method according to claim 21, wherein the multiple primary electron beams are focused to final foci by means of electric or magnetic focusing fields.

24. The method according to claim 23, wherein the final focus lengths of the final foci are determined by counting the number of segments that are hit by the primary electron beams.

25. The method according to claim 23, wherein the final focus lengths of the primary electron beams are adjusted to desired final focus lengths by means of the electric or magnetic focusing fields.

26. A method to adjust final focus lengths of focused multiple primary electron beams to desired final focus lengths, comprising:
providing a multiple electron beam device with an array of electron beam sources;
generating multiple primary electron beams by means of the electron beam sources;
directing the primary electron beams towards an electron sensor with electron sensor segments;
focusing the primary electron beams by means of electric or magnetic focusing fields;
for each primary electron beam determining a number of segments directly hit by the corresponding primary electron beam without having to move
(a) said electron sensor,
(b) said specimen, or
(c) said electron sensor and said specimen; and
for each primary electron beam adjusting the final focus length to a desired final focus length by changing the electric or magnetic focusing fields until a desired number of segments is hit by the corresponding primary electron beam.

27. The method according to claim 21, wherein the multiple electron beam device is a multiple electron beam device according to claim 1.

28. The method according to claim 23, wherein the electric or magnetic focusing fields are generated by individually focusing components.

29. The method according to claim 21, wherein the lateral distances between neighboring primary electron beams, D1, are magnified by at least one magnifying lens.

30. The method according to claim 21, wherein the surface of the electron sensor segments is movable towards the upper surface of a non-transparent specimen.

31. The method according to claim 21, wherein data containing information of the data read from the electron sensor is written onto a data storage device.

32. The method according to claim 21, wherein the currents of the primary electron beams are measured by means of the electron sensor.

33. The method according to claim 32, wherein for each primary electron beam the current of the primary electron beam is adjusted to a desired current value.

34. The beam device of claim 1, wherein said electron sensor is configured to directly detect electrons of the primary electron beams individually without having to move said electron sensor for a calibration process.

35. The beam device of claim 3, wherein said electron sensor is configured to directly detect electrons of the primary electron beams individually without having to move said electron sensor for a calibration process.

* * * * *